(12) United States Patent
Seko

(10) Patent No.: US 9,589,608 B2
(45) Date of Patent: Mar. 7, 2017

(54) SEMICONDUCTOR MEMORY DEVICE

(75) Inventor: Akiyoshi Seko, Chuo-ku (JP)

(73) Assignee: Longitude Semiconductor S.A.R.L., Luxembourg (LU)

(*) Notice: Subject to any disclaimer, the term of this patent is extended or adjusted under 35 U.S.C. 154(b) by 2114 days.

(21) Appl. No.: 12/730,859

(22) Filed: Mar. 24, 2010

(65) Prior Publication Data

US 2010/0246302 A1    Sep. 30, 2010

(30) Foreign Application Priority Data

Mar. 26, 2009  (JP) ................. 2009-075631

(51) Int. Cl.
G11C 7/02 (2006.01)
G11C 7/12 (2006.01)
G11C 7/18 (2006.01)
G11C 13/00 (2006.01)

(52) U.S. Cl.
CPC .............. G11C 7/12 (2013.01); G11C 7/02 (2013.01); G11C 7/18 (2013.01); G11C 13/004 (2013.01); G11C 13/0026 (2013.01)

(58) Field of Classification Search
CPC ............ G11C 13/0026; G11C 13/0033; G11C 13/004; G11C 13/0054
USPC ................. 365/205, 210.12, 210.14
See application file for complete search history.

(56) References Cited

U.S. PATENT DOCUMENTS

| | | | |
|---|---|---|---|
| 5,870,343 A * | 2/1999 | Chi et al. ...................... 365/203 |
| 6,046,940 A * | 4/2000 | Takeuchi et al. ......... 365/185.17 |
| 6,058,044 A * | 5/2000 | Sugiura et al. .......... 365/185.17 |
| 7,436,708 B2 * | 10/2008 | Roohparvar ............. 365/185.18 |
| 2002/0064075 A1 | 5/2002 | Morishima |
| 2007/0171693 A1 * | 7/2007 | Koyama ........................ 365/145 |
| 2008/0037309 A1 * | 2/2008 | Makino ..................... G11C 7/12 365/63 |
| 2008/0247233 A1 | 10/2008 | Kawabata et al. |
| 2011/0211395 A1 * | 9/2011 | Miakashi ............ G11C 11/5628 365/185.18 |

(Continued)

FOREIGN PATENT DOCUMENTS

| | | |
|---|---|---|
| JP | 2001-143490 A | 5/2001 |
| JP | 2002-170388 A | 6/2002 |

(Continued)

*Primary Examiner* — Nimeshkumar Patel
*Assistant Examiner* — Christopher Raabe

(57) ABSTRACT

In a semiconductor memory device storing a resistance difference as information, a long time is taken so as to charge and/or discharge a selected cell by an equalizer circuit, which results in a difficulty of a high speed operation. A selection circuit puts, in a selected state, at least three bit lines which includes a selected bit line connected to a selected memory cell together with unselected bit lines adjacent to the selected bit line on both sides of the selected bit line. The selected and the unselected bit lines are coupled to sense amplifiers through an equalizer circuit. The equalizer circuit puts both the selected and the unselected bit lines into charging states and thereafter puts only the selected bit line into a discharging state to perform a sensing operation. On the other hand, the unselected bit lines are continuously kept at the charging states during the sensing operation. This makes it possible to perform the sensing operation at a high speed with a rare malfunction.

22 Claims, 10 Drawing Sheets

(56) References Cited

U.S. PATENT DOCUMENTS

| | | | | |
|---|---|---|---|---|
| 2012/0063241 A1* | 3/2012 | Kajigaya | ............. | G11C 11/4097 365/189.04 |
| 2012/0250437 A1* | 10/2012 | Nagata | .................... | G11C 7/18 365/200 |
| 2013/0235641 A1* | 9/2013 | Iwaki | .................... | G11C 5/063 365/63 |

FOREIGN PATENT DOCUMENTS

| | | | |
|---|---|---|---|
| JP | 2005-537597 A | 12/2005 | |
| JP | 2008-257783 A | 10/2008 | |
| WO | 2004/019341 A1 | 3/2004 | |

* cited by examiner

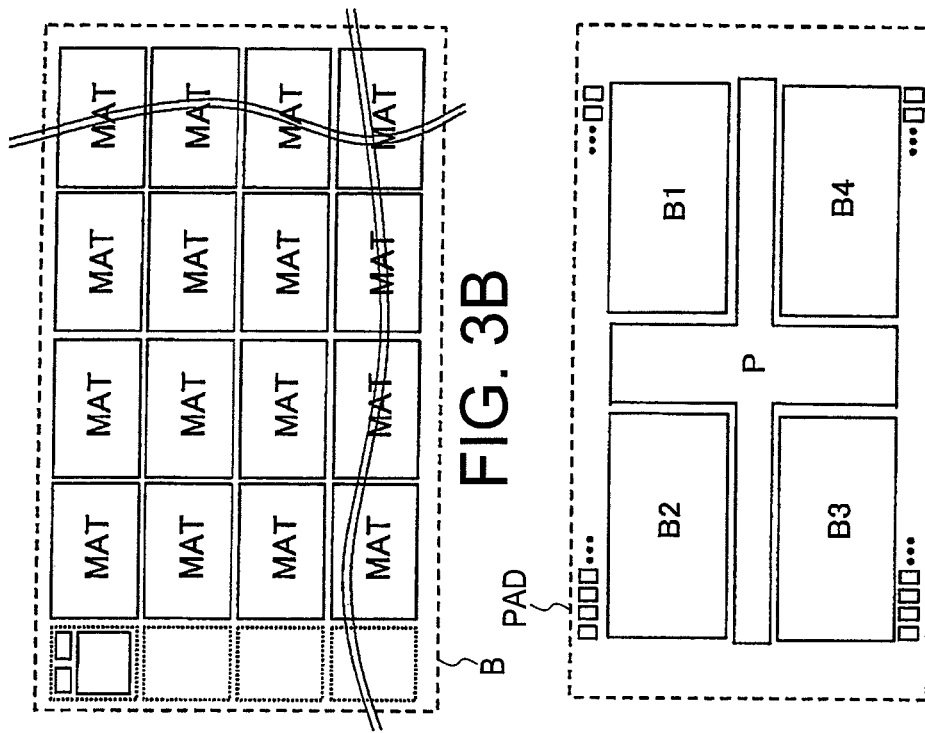
FIG. 3A
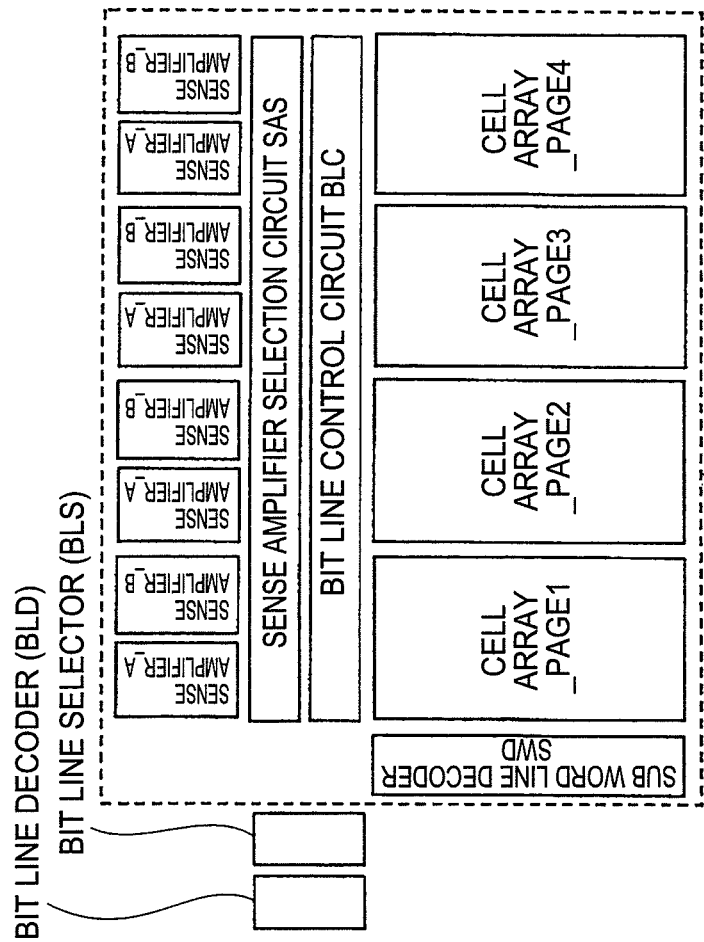
FIG. 3B
FIG. 3C

SEMICONDUCTOR MEMORY DEVICE

This application is based upon and claims the benefit of priority from Japanese patent application No. 2009-075631, filed on Mar. 26, 2009, the disclosure of which is incorporated herein in its entirety by reference.

BACKGROUND OF THE INVENTION

1. Field of the Invention

This invention relates to a semiconductor device, and more particularly, to a nonvolatile semiconductor memory device and a semiconductor device including the semiconductor memory device. Furthermore, this invention also relates to a device, such as an electronic device, which includes the semiconductor device mentioned above.

2. Description of the Related Art

In recent years, as a semiconductor memory device, other than a volatile memory which loses its data when power supply is turned off, there are proposed various types of nonvolatile semiconductor memories which can hold stored data even if power supply is turned off. For instance, as this type of nonvolatile semiconductor memory, there are proposed a static type semiconductor memory device, a mask read only memory (MROM), a programmable read only memory (PROM), an ultra-violet programmable read only memory (UV-EPROM), an electrically erasable read only memory (EEPROM), and the like. Among them, as the EEPROM, a NAND type or NOR type flash memory is known and is widely sold.

Among technologies of those nonvolatile semiconductor memories, a technology of a general ROM is disclosed in Japanese Unexamined Patent Application Publication (JP-A) No. 2001-143490. Japanese Unexamined Patent Application Publication (JP-A) No. 2001-143490 discloses a data read assist circuit that is used when data is read from a ROM. The data read assist circuit disclosed in Japanese Unexamined Patent Application Publication (JP-A) No. 2001-143490 performs an operation of applying the same potential to selected bit lines and unselected bit lines before reading data when data is read from a ROM element selected by bit lines and a word line, and also carries out an operation of connecting the unselected bit lines to the ground after starting the actual data reading (sensing) of the selected bit lines. Thus, capacitance between the selected bit line and the unselected bit line can be reduced before reading data, and hence data can be read at high speed.

Japanese Unexamined Patent Application Publication (JP-A) No. 2002-170388 discloses a static type semiconductor memory device which can reduce interference between bit lines when memory cell data is read so that a transition speed of an amplitude on each bit line can be increased. Therefore, Japanese Unexamined Patent Application Publication (JP-A) No. 2002-170388 discloses a precharge control circuit and a bit line load circuit for maintaining even bit lines in a precharged state if memory cell data is read on odd bit lines when the memory cell is selected. In other words, potential of an adjacent bit line is charged to a high voltage from a so-called standby state before starting to access, and the potential does not change after the access.

Further, Japanese Patent Translation Publication No. 2005-537597 discloses a flash memory device in which sources and drains of memory cells are connected linearly in the row direction so as to form a linear chain, and precharging thereof. Disclosed therein is a so-called chain type cross point memory array in which gates of memory cells in the row forming the linear chain are connected to a common word line, and a column line is connected as a bit line to a node between adjacent memory cells of the linear chain. In Japanese Patent Translation Publication No. 2005-537597, the precharge is performed by applying a sensing voltage to the selected bit lines and by applying the voltage also to the bit line adjacent to the selected bit line. Thus, the application of the sensing voltage to the selected bit lines can prevent leak current flowing to the adjacent bit line through the adjacent memory cell.

In addition, Japanese Unexamined Patent Application Publication (JP-A) No. 2008-257783 discloses a nonvolatile memory device in which a plurality of memory cells are connected in series. Here, it is proposed to change drive capacity in a discontinuous access operation of a burst operation so as to reduce current consumption and access time.

On the other hand, in Japanese Patent Application No. 2009-23248, the inventor of this invention has proposed a semiconductor memory device in which a memory cell is formed of an access transistor and a nonvolatile memory element (hereinafter simply referred to as a memory element) which stores information by a resistance difference, and a method of reading the semiconductor memory device. It is confirmed that the semiconductor memory device can operate as a nonvolatile RAM. Therefore, the semiconductor memory device disclosed in Japanese Patent Application No. 2009-23248 can hold information even if the power supply is turned off. In addition, the semiconductor memory device has various other advantages which are rewritable, capable of page reading, and capable of random access similarly to a DRAM, and so on. However, according to further studies by the inventor of this invention, it has been found that further increase of speed is necessary also in a semiconductor memory device using a memory element which utilizes a resistance difference.

Japanese Unexamined Patent Application Publication (JP-A) No. 2001-143490 discloses only that a high speed operation of the ROM is achieved by applying the same potential to the selected bit line and the unselected bit line of the ROM, and does not disclose any problem that is inherent in the RAM using the memory element as disclosed in Japanese Patent Application No. 2009-23248. Further, the adjacent bit line is discharged to the original ground potential intentionally in the sensing action, which makes a noise source reducing sensitivity in sensing a micro potential by its capacitance coupling noise.

Japanese Unexamined Patent Application Publication (JP-A) No. 2002-170388 discloses only a high speed operation of the static type semiconductor device capable of random access, and does not disclose any semiconductor memory device including a memory element which utilizes a resistance difference and its problem.

Further, each of Japanese Patent Translation Publication No. 2005-537597 and Japanese Unexamined Patent Application Publication (JP-A) No. 2008-257783 discloses a rewritable, nonvolatile semiconductor memory device in which memory cells are connected linearly to form a linear chain. However, the semiconductor memory devices disclosed in Japanese Patent Translation Publication No. 2005-537597 and Japanese Unexamined Patent Application Publication (JP-A) No. 2008-257783 disclose only charging of the bit lines of the memory cells connected linearly, and do not discuss any connection relationship between the bit line and the sense amplifier.

Here, the problem of the semiconductor memory device disclosed in Japanese Patent Application No. 2009-23248 is described concretely. In the memory cell including the memory element utilizing a resistance difference, before reading stored information, the memory cell is selected and the bit line connected to the memory cell is connected to the ground so that charges are once discharged. After that, an equalizer circuit puts the memory cell into a charged state (i.e., equalized state) via the selected bit line, and then current is supplied (sensing) to the memory element that stores information by a resistance difference. A variation of potential or a variation of current caused by supplying current is read by a sense amplifier. In this case, the sense amplifier receives a potential variation due to the current flowing through the memory cell charged by the equalizer circuit, and then the potential variation is amplified so as to output the information in the state where the equalizer circuit and the bit line are electrically disconnected from the sense amplifier temporarily. In this way, it is found that a high speed operation can not be realized in the semiconductor memory device having the equalizer circuit for charging the bit line connected to the sense amplifier.

In addition, the adjacent unselected bit line is connected to the GND when the selected bit line is charged by the equalizer circuit. In this event, there is a problem that the potential of the adjacent unselected bit line is raised during the charging action. This is because a circuit connected to the GND has a portion physically far from the selected bit line and is capacitively coupled to the selected bit line. There is a problem that a discharge of this raised potential causes coupling noise which is given to the selected bit line under the sensing action.

Herein, it is assumed that the technology of applying the same potential to the selected bit line and a bit line adjacent to the selected bit line is adopted in the semiconductor memory device disclosed in Japanese Patent Application No. 2009-23248, like in Japanese Unexamined Patent Application Publication (JP-A) No. 2001-143490, Japanese Unexamined Patent Application Publication (JP-A) No. 2002-170388, Japanese Patent Translation Publication No. 2005-537597, and Japanese Unexamined Patent Application Publication (JP-A) No. 2008-257783. However, it has been found out that using the equalizer circuit disclosed in Japanese Patent Application No. 2009-23248 makes it difficult to achieve both the high speed operation and the sensing action with little error.

SUMMARY OF THE INVENTION

This invention seeks to provide one or more of the above-mentioned problems

This invention provides a semiconductor memory device including: a plurality of memory cells each including a memory element for storing information by a resistance difference; bit lines which are connected to the plurality of memory cells, respectively; a selection circuit for selecting the bit lines based on an address so as to connect the selected bit line to bit lines laid on a sense amplifier side; a first sense amplifier connected to each of the bit lines laid on the sense amplifier side; a second sense amplifier which is controlled in a manner different from the first sense amplifier; a first circuit which controls the bit line to put the bit line into a first potential; and a second circuit which controls the bit lines to put them into a second potential via the bit lines laid on the sense amplifier side, wherein the selection circuit selects a selected bit line to which the memory cell as an access target is connected and selects unselected bit lines arranged on both sides of the selected bit line, and the second circuit includes: a first switch circuit which connects an equalizer voltage source for supplying the second potential to the selected bit line on a side of the first sense amplifier so as to charge the selected bit line from the first potential to the second potential, and which disconnects the equalizer voltage source from the selected bit line on the side of the first sense amplifier after the charging; and a second switch circuit which connects the equalizer voltage source to the unselected bit lines so as to charge the unselected bit lines from the first potential to the second potential, and which keeps a connection state between the equalizer voltage source and the unselected bit lines on the side of the second sense amplifier even after the selected bit line is disconnected by the first switch circuit.

More specifically, as to the above-mentioned second circuit, when the access operation to the memory cell is started, each second circuit corresponding to the selected bit line and adjacent bit lines physically adjacent to the selected bit line on both sides of the selected bit line is enabled, and the selected bit line and the adjacent bit lines are controlled from the first potential to the second potential. After that, the second circuit corresponding to the selected bit line is disabled to stop the supply of the second potential to the selected bit line so that the potential of the selected bit line changes in accordance with information of the selected memory cell. On the other hand, the second circuit corresponding to the adjacent bit line is maintained in the enabled state so as to maintain the second potential of the adjacent bit line.

According to this invention, the selected bit line can be charged via the equalizer circuit at a high speed. As a result, the access operation in the semiconductor memory device can be performed at high speed. Further, according to this invention, the equalizer circuit is controlled so as to keep the charging control of the adjacent bit lines even after the bit line is charged. Thus, the selected bit line can be sensed with micro current, to thereby reduce influence of capacitance coupling noise from the adjacent bit lines.

BRIEF DESCRIPTION OF THE DRAWINGS

The above features and advantages of this invention will be more apparent from the following description of certain preferred embodiments taken in conjunction with the accompanying drawings, in which:

FIGS. 3A, 3B and 3C are layout diagrams schematically illustrating respectively a chip structure, a bank structure in a chip, and a MAT structure in a bank of the semiconductor memory device according to this invention;

DETAILED DESCRIPTION OF THE PREFERRED EMBODIMENTS

Figures 1A, 1B:
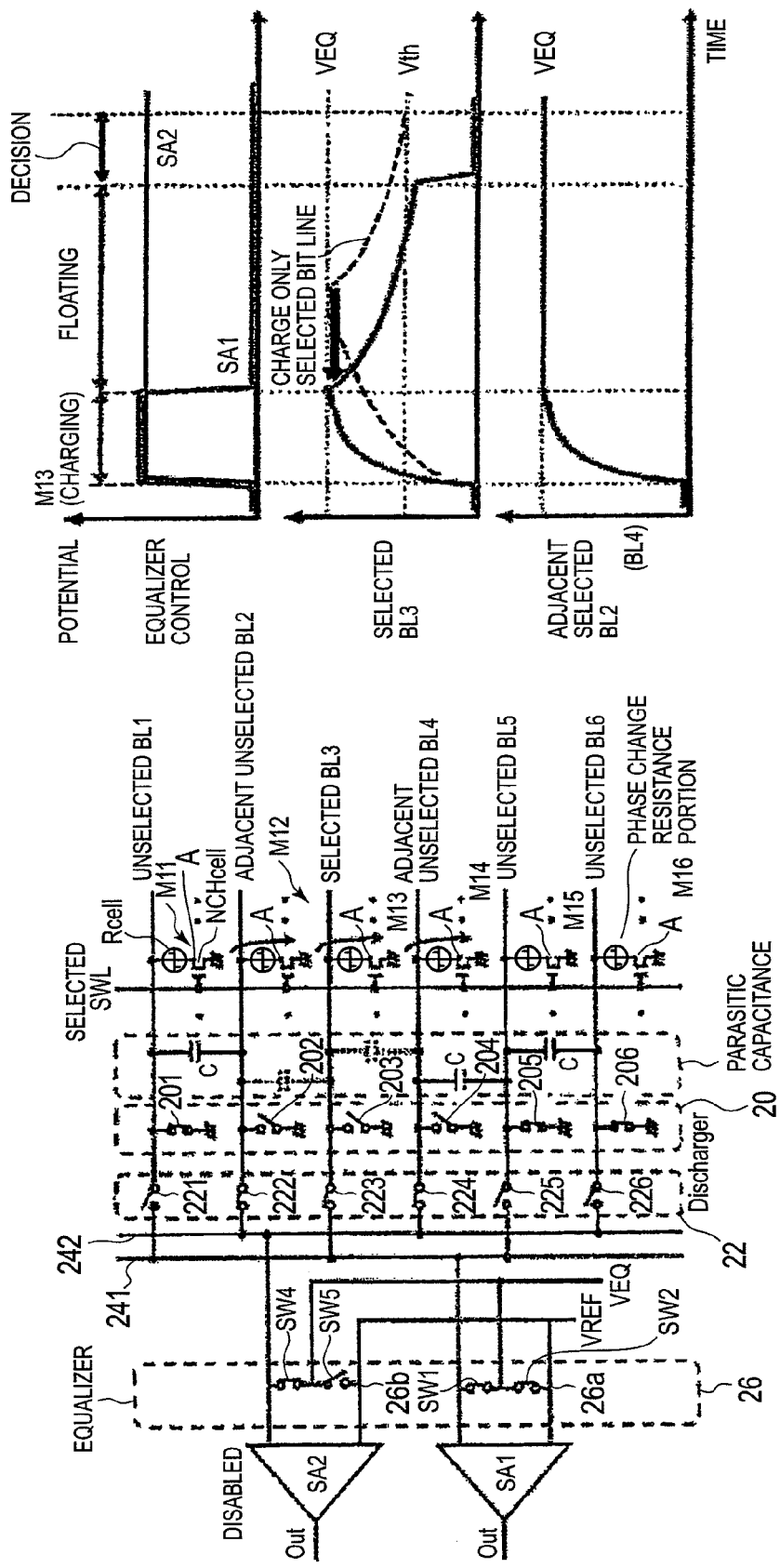
FIG. 1A is a general circuit diagram for describing a principle of a semiconductor memory device according to this invention.
FIG. 1B is a waveform diagram for describing an operation of the semiconductor memory device.

A typical example of a technical concept of a semiconductor memory device according to this invention is described in a theoretical manner with reference to FIGS. 1A and 1B. However, it is needless to say that claiming contents of the present application are not limited to this technical concept and may include contents described in the claims of the present application. First, as illustrated in FIG. 1A, the semiconductor memory device to which this invention is applicable includes a plurality of bit lines BL extending in a row direction (horizontal direction in FIG. 1A) and word lines WL extending in a column direction (vertical direction in FIG. 1A). In FIG. 1A, simple illustration is made only about six bit lines BL1 to BL6 and about a single word line WL which crosses the bit lines BL1 to BL6 and which is in a selected state. Therefore, one word line WL is illustrated as a selected word line SWL in FIG. 1A.

On the other hand, memory cells are connected to cross points between the bit lines BL1 to BL6 and the selected word line SWL, respectively. In the illustrated example, only the memory cells M11 to M16 are illustrated, but the memory cells are arranged in a matrix shape including cross points between the bit lines BL1 to BL6 and unselected word lines which are not illustrated. In addition, memory cells are also arranged at cross points between unselected word lines and bit lines both of which are not illustrated.

Here, each of the memory cells (here, M11 to M16) is formed of an access transistor NCHcell (N-channel transistor) and a memory element Rcell. Each of the memory cells M11 to M16 has the same structure to one another, and hence the access transistor NCHcell and the memory element Rcell of the memory cell M11 are only denoted by the reference symbols in FIG. 1A. The illustrated memory element Rcell is a nonvolatile memory element which stores information by a resistance difference and is supposed to be formed of a phase change resistance element. On the other hand, the access transistor NCHcell is a cell selection element for accessing the memory cell.

One end of each phase change element of the memory element Rcell and a drain of the access transistor NCHcell are connected to each other at a common connection node A, and another end of the memory element Rcell is connected to the bit line BL extending in the row direction. On the other hand, a gate of each access transistor NCHcell is connected to the word line WL extending in the column direction. In addition, a source of each access transistor NCHcell is connected to the ground.

The illustrated semiconductor memory device includes a discharge circuit (or discharger) 20 for selectively connecting the bit lines BL1 to BL6 to the ground potential so as to discharge charges in the memory cells M11 to M16, and a selection switch circuit 22 for selecting the bit lines BL1 to BL6. In this example, the discharge circuit 20 is formed of discharge switches 201 to 206 for connecting the individual bit lines BL1 to BL6 to the ground. On the other hand, the selection switch circuit 22 is formed of column selection switches 221 to 226 which are arranged along a column direction (Y direction), which turn on and off (connect and disconnect) bit lines BL1 to BL6 to selectively connect the bit lines laid on a side of the memory cells to those laid on a side of sense amplifiers which are connected to an input of the sense amplifier. Here, the discharge circuit 20 serves to perform an operation as a first circuit for performing discharge.

Further, among the illustrated bit lines BL1 to BL6, odd numbered bit lines BL1, BL3, and BL5 are connected to a first equalizer power supply line 241 (which may also serve as bit lines on the sense amplifier side) for supplying an equalizer voltage VEQ, and even numbered bit lines BL2, BL4, and BL6 are connected to a second equalizer power supply line 242 (which may also serve as bit lines on the sense amplifier side) for similarly supplying the equalizer voltage VEQ, via the column selection switches 221 to 226, respectively.

In addition, the first equalizer power supply line 241 is connected to a first sense amplifier circuit SA1 via the equalizer circuit 26, and the second equalizer power supply line 242 is connected to a second sense amplifier circuit SA2 via the equalizer circuit 26. Here, the equalizer circuit 26 operates as a second circuit for supplying the equalizer voltage VEQ.

The first and the second sense amplifier circuits SA1 and SA2 are supplied with a reference voltage VREF via the equalizer circuit 26. In this way, each of the first and the second sense amplifier circuits SA1 and SA2 includes an equalizer voltage terminal and a reference voltage terminal, and amplifies a difference between voltages applied to the terminals so as to output the result.

Here, the equalizer circuit 26 includes two switches SW1 and SW2 which are connected to the first equalizer power supply line 241 and selectively supply the equalizer voltage VEQ between the equalizer voltage terminal and the reference voltage terminal of the first sense amplifier circuit SA1, and those switches SW1 and SW2 constitute a first equalizer portion 26a.

Further, the illustrated equalizer circuit 26 includes two switches SW4 and SW5 which are connected to the second equalizer power supply line 242 and selectively supply the equalizer voltage VEQ between the equalizer voltage terminal and the reference voltage terminal of the second sense amplifier circuit SA2, and those switches SW4 and SW5 constitute a second equalizer portion 26b.

In the illustrated semiconductor memory device, it is supposed that the bit line BL3 is selected among the bit lines BL1 to BL6 that are respectively connected to the memory cells M11 to M16 that are connected to the selected word line SWL. As a result, FIG. 1A illustrates the case where information stored in the memory cell M13 connected to the bit line BL3 is read out.

In this invention, when the bit line BL3 is selected by the selection switch circuit 22, the unselected bit lines BL2 and BL4 that are physically adjacent to the bit line BL3 on both sides of the bit line BL3 are also put in the selected state selected by the selection switch circuit 22. In other words, three bit lines on the memory cell side are connected to the bit lines on the sense amplifier side. (To be accurate, the selected bit line BL3 that is the bit line on the memory cell side is connected to the bit line 241 on the first sense amplifier side, and the adjacent unselected bit lines BL2 and BL4 on both sides of the bit line BL3 on the memory cell side are commonly connected to the bit line 242 on the second sense amplifier side.) Discharge switches 203, 202, and 204 corresponding to the bit lines BL3, BL2, and BL4 of the discharge circuit 20 are closed (connected) during a so-called standby period, and the charges of corresponding memory cells M13, M12, and M14 are once discharged. FIG. 1A illustrates a case where the discharge switches 203, 202, and 204 are opened (disconnected) during a start period of the memory cell access after they are closed. In this way, when the column selection switches 223, 222, and 224 of the selection switch circuit 22 are controlled to be closed (connected), the corresponding discharge switches (discharge switches 203, 202, and 204) are put into opened states. In other words, the discharge switches 203, 202, and 204 corresponding to the column selection switches 223, 222, and 224 are controlled to be associated with each other.

Other discharge switches 201, 205, and 206, and corresponding column selection switches 221, 225, and 226 perform the operation opposite to those of the above-mentioned switches so that the discharge switches 201, 205, and 206 are closed, and the column selection switches 221, 225, and 226 are opened, as illustrated in FIG. 1A.

In the illustrated state, the selected bit line BL3 is connected to the first equalizer power supply line 241 (bit line on the sense amplifier side) via the column selection switch 223. Other odd bit numbered lines BL1 and BL5 are not connected to the first equalizer power supply line 241 because the column selection switches 221 and 225 are opened. As a result, only the memory cell M13 is connected to the first sense amplifier circuit SA1 via the selected bit line BL3 and the first equalizer power supply line 241.

On the other hand, the adjacent unselected bit lines BL2 and BL4 that are physically adjacent to the selected bit line BL3 on both sides of the selected bit line BL3 and are connected to the closed column selection switches 222 and 224 are commonly connected to the second equalizer power supply line 242 (bit line on the sense amplifier side) and are connected to the second sense amplifier SA2. The other even numbered bit line BL6 is not connected to the second sense amplifier SA2 because the column selection switch 226 is opened.

In this way, in the selected bit line BL3 and the unselected bit lines BL2 and BL4 connected to the closed column selection switches 223, 222, and 224, and the opened discharge switches 203, 202, and 204, the memory cells M13, M12, and M14 are connected to the first and the second equalizer power supply lines 241 and 242.

Therefore, the memory cell M13 is supplied with the equalizer voltage VEQ via the first equalizer power supply line 241 and the equalizer circuit 26 so that the memory cell M13 is charged. On the other hand, the memory cells M12 and M14 are supplied with the equalizer voltage VEQ via the second equalizer power supply line 242 and the equalizer circuit 26 so that the memory cells M12 and M14 are charged. As to the reference voltage VREF, the same charging operation is performed.

With this structure, a potential difference between the selected bit line BL3 and the adjacent unselected bit lines BL2 and BL4 is very small. Therefore, parasitic capacitance between the selected bit line BL3 and the adjacent unselected bit line BL2, and parasitic capacitance between the selected bit line BL3 and the adjacent unselected bit line BL4 can be reduced to the extent that they can be neglected. Thus, the bit line potential rises at a high speed so that charging of the parasitic capacitance between the memory element Rcell and the access transistor NCHcell can be performed more easily than before. As a result, the selected bit line BL3 can complete the charging operation at high speed. In this case, because the parasitic capacitance between the adjacent unselected bit line and the selected bit line is small, charging current may not be as large as three times the case where only the selected bit line is charged, and current consumption is not increased so much.

On the other hand, as disclosed in Japanese Patent Application No. 2009-23248 proposed by the inventor of this invention, if the equalizer voltage is not applied to the adjacent unselected bit line BL2 or BL4 adjacent to the selected bit line BL3, a potential difference is generated by the equalizer voltage between the selected bit line BL3 and the unselected bit line BL2 or BL4. As a result, parasitic capacitance C is added between the bit lines BL3 and BL2 or BL4.

Here, if the memory element Rcell of the memory cell M (Rcell of M13) has a high resistance characteristic (indicating one piece of information in memory cell information), it takes long period for charging the memory cell (Rcell of M13 and node between Rcell of M13 and access transistor NCHcell). In a nonvolatile memory element which stores information by a resistance difference, it is an important factor for sensing to charge the node to a predetermined potential at high speed during the access period (initial setting operation for starting actual sensing after starting the access).

According to an experiment performed by the inventor of this invention, the following fact is found. When only the selected bit line is charged, it took approximately 3 ns for the charging operation. In contrast, when not only the selected bit line BL3 but also the unselected bit lines BL2 and BL4 on both sides of the selected bit line BL3 are charged as illustrated in FIG. 1A, the charging period can be shortened down to approximately 1 ns, and hence high speed operation can be achieved.

In the equalizer circuit 26 illustrated in FIG. 1A, the switches SW1 and SW2 connected to the first sense amplifier SA1 are all closed when the memory cell M13 is charged by the equalizer voltage VEQ. Therefore, the equalizer voltage VEQ is applied to the memory cell M13 via the switch SW1 of the equalizer circuit 26, the first equalizer power supply line 241, the column selection switch 223, and the selected bit line BL3, and hence the memory cell M13 is charged by the equalizer voltage VEQ.

While the memory cell M13 is charged, the equalizer voltage VEQ and the reference voltage VREF are not supplied to the first sense amplifier SA1 because of the switch (not shown) disposed between the sense amplifier SA1 and the equalizer circuit 26. Therefore, the first sense amplifier SA1 has not performed the sensing operation yet.

On the other hand, among the switches SW4 and SW5 that are connected to the second sense amplifier SA2, only the switch SW4 that is connected to the equalizer power supply line 242 side is closed while the switch SW5 on the reference power supply line side is opened. As a result, the equalizer voltage VEQ is supplied to the memory cell M12 via the switch SW4 of the equalizer circuit 26, the column selection switch 222, and the unselected bit line BL2 so as to charge the memory cell M12. In the same manner, the memory cell M14 is also charged via the switch SW4, the column selection switch 224, and the unselected bit line BL4.

On the other hand, the switch SW5 in the equalizer circuit 26 is opened. This is for a purpose of sensing operation that is described later. Note that in the period while the memory cells M12 and M14 are charged, the equalizer voltage VEQ and the reference voltage VREF are not supplied to the second sense amplifier SA2 because of the switch (not shown) disposed between the sense amplifier SA2 and the equalizer circuit 26.

When the charging operation of the memory cell M13 (Rcell of M13 and node between Rcell of M13 and NCHcell) is finished, the switches SW1 and SW2 of the equalizer circuit 26 connected to the first sense amplifier SA1 are opened. This is for a purpose of sensing operation that is described later. On the other hand, the switches SW4 and SW5 of the equalizer circuit 26 connected to the second sense amplifier SA2 maintain the illustrated state during the period while the memory cell M13 is sensed.

With reference to FIG. 1B, there are illustrated temporal state changes in a gate control voltage applied to the transistors (SW1, SW2, SW4, and SW5) that are switches of the equalizer circuit 26 that is connected to the first and the second sense amplifiers SA1 and SA2 upon the equalizer control, the selected bit line BL3, and the adjacent unselected bit line BL2. In the period while the memory cell M13 is charged, the gate control voltage (SW1, SW2, SW4, and SW5) of the first and the second sense amplifiers SA1 and SA2 are high level. As a result, potential of the selected bit line BL3 is assisted by a change in the adjacent unselected bit lines BL2 and BL4 so as to increase rapidly.

When the charging operation is finished and the sensing operation starts, the control voltage of the equalizers (SW1 and SW2) related to the first sense amplifier SA1 is decreased to low level while the gate control voltage of the equalizer (SW4) related to the second sense amplifier SA2 is maintained to be high level. As a result, each state of the adjacent unselected bit lines BL2 and BL4 connected to the second sense amplifier SA2 is maintained to be a voltage value (divided voltage value) determined by the current due to the equalizer voltage VEQ and current due to a resistance value indicating memory cell information of the corresponding memory cells (M12 and M14) during the sensing operation of the memory cell M13. FIG. 1B illustrates the case where the resistance values of the memory cells (M12 and M14) are both high resistance values. It should be noted that, in general, current supplying capability value of the equalizer voltage VEQ is sufficiently larger than current supplying capability value of the memory cell (high resistance/low resistance), and the divided voltage value is very close to the equalizer voltage VEQ.

On the other hand, when the first sense amplifier SA1 is supplied with a low level gate control voltage and the switches SW1 and SW2 of the equalizer circuit 26 are opened, the equalizer circuit 26 is disconnected from the first sense amplifier SA1. In this state, the first sense amplifier SA1 performs sensing operation (decision operation) for detecting potential variation or transition in the memory cell M13. In this case, the state of the selected bit line BL3 changes to a decision state (state that can be compared with the VREF voltage) through a discharge process in which the voltage decreases gradually, in accordance with information (resistance value) stored in the memory cell M13. In this state, the equalizer voltage VEQ is not supplied to the selected bit line BL3 because the switch SW1 is opened (disconnected).

In the sensing operation, comparison with a predetermined threshold value voltage Vth (corresponding to VREF) is performed, and a result of the comparison is read out as information stored in the memory cell M13 with the first sense amplifier SA1. Here, the case where the information read out from the memory cell M13 is lower than the threshold value voltage Vth is illustrated. Note that the reference voltage VREF includes a reference constant current source CIREF (not shown) that is charged by the equalizer voltage VEQ similarly to the selected bit line as described above and is set to a resistance value that is intermediate between resistance values (high resistance and low resistance) corresponding to information 0 and 1 of the memory cell. In other words, the threshold value voltage Vth indicates that the potential difference between the reference voltage VREF changed in accordance with the current value supplied from the reference constant current source CIREF and the selected bit line voltage changed in accordance with the current value supplied from the selected memory cell is put in the state where the corresponding sense amplifier SA1 can sense without a malfunction. Therefore, the threshold value voltage Vth corresponds to the reference voltage VREF.

On the other hand, if only the selected bit line BL3 of FIG. 1A is selected, potential of the selected bit line BL3 (Rcell of M13 and node between Rcell of M13 and access transistor NCHcell) in FIG. 1B varies as illustrated by the broken line. In other words, charging of the selected bit line BL3 is largely delayed, and as a result, if the comparison with the threshold value voltage Vth is performed during the illustrated decision period for comparing with the threshold value voltage Vth, wrong read information is read out. Therefore, it is necessary to increase the charging period and the discharging period, and to delay the decision time from the illustrated time.

In this way, if the memory element that stores information by a resistance difference is used, it is necessary, before reading out information from the memory cell, to discharge the charges of the memory cell once by the discharge circuit 20, and then to charge the memory cell by the equalizer circuit 26 in the state where the sense amplifier is disconnected. In addition, in order to perform the decision (sensing) after charging, it is necessary to detect a variation on the bit line by disconnecting the equalizer circuit 26 from the sense amplifier SA1. In this way, if the memory element that requires charging and discharging before sensing in the access period is used, it is necessary to consider not only connection between the bit line and the sense amplifier but also connection and disconnection between the sense amplifier and the equalizer circuit.

In particular, if the selected bit line and the unselected bit line that is adjacent to the selected bit line are charged simultaneously, the selected bit line can be charged at high speed. However, there is a problem of connection and disconnection of the equalizer circuit connected to the selected bit line and the unselected bit line. Therefore, this invention provides the structure in which the selected bit line and the adjacent unselected bit lines are connected to individual sense amplifiers that are controlled differently for enabling selection, and the equalizer voltage VEQ is supplied from individual equalizer circuits that are connected to the bit lines on the sense amplifier side and are controlled differently for enabling selection.

In the semiconductor memory device according to the principle of this invention, the equalizer circuit related to the unselected bit lines is not disconnected from the equalizer circuit even after the unselected bit lines are charged and are controlled to supply the equalizer voltage successively to the unselected bit lines, and the control is maintained also during the period while the memory cell connected to the selected bit line is sensed. Thus, it is possible to provide the structure in which the sense amplifier (SA1) connected to the selected bit line does not generate noise which causes sensing malfunction mainly due to interference between the bit lines during the period of the sensing period.

The typical example of the technical concept of the semiconductor memory device according to this invention is summarized as follows.

When the plurality of memory cells including the memory element which stores information by a resistance difference are selected so that the equalizer circuit charges the bit line before sensing in the access period, at least three bit lines including the selected bit line connected to the selected memory cell and the unselected bit lines adjacent to the selected bit line on both sides of the selected bit line are put into the selected state by the selection circuit for selectively connecting the bit lines on the memory cell side with the bit lines on the sense amplifier side, so as to charge the three bit lines from the equalizer circuit disposed at the bit lines on the sense amplifier side. After that, equalizing of the selected bit line is stopped so as to perform the discharge of the selected bit line corresponding to the memory cell information.

On the other hand, the equalizing control of the adjacent bit lines is continuously performed during the sensing period by applying continuously the equalizer voltage to the adjacent bit lines. This makes it possible to provide the semiconductor memory device which can realize high speed sensing with a rare malfunction. It is to be noted that the sense amplifiers SA may have various structures and may be operated in various manners. In addition, it is also noted that in the technical concept of this invention, the sense amplifier SA is disconnected from the bit line which is laid on the sense amplifier side and which is connected to the sense amplifier in the sensing operation. As a result, the sense amplifier can amplify a very small signal to carry out a read operation.

Figure 2:
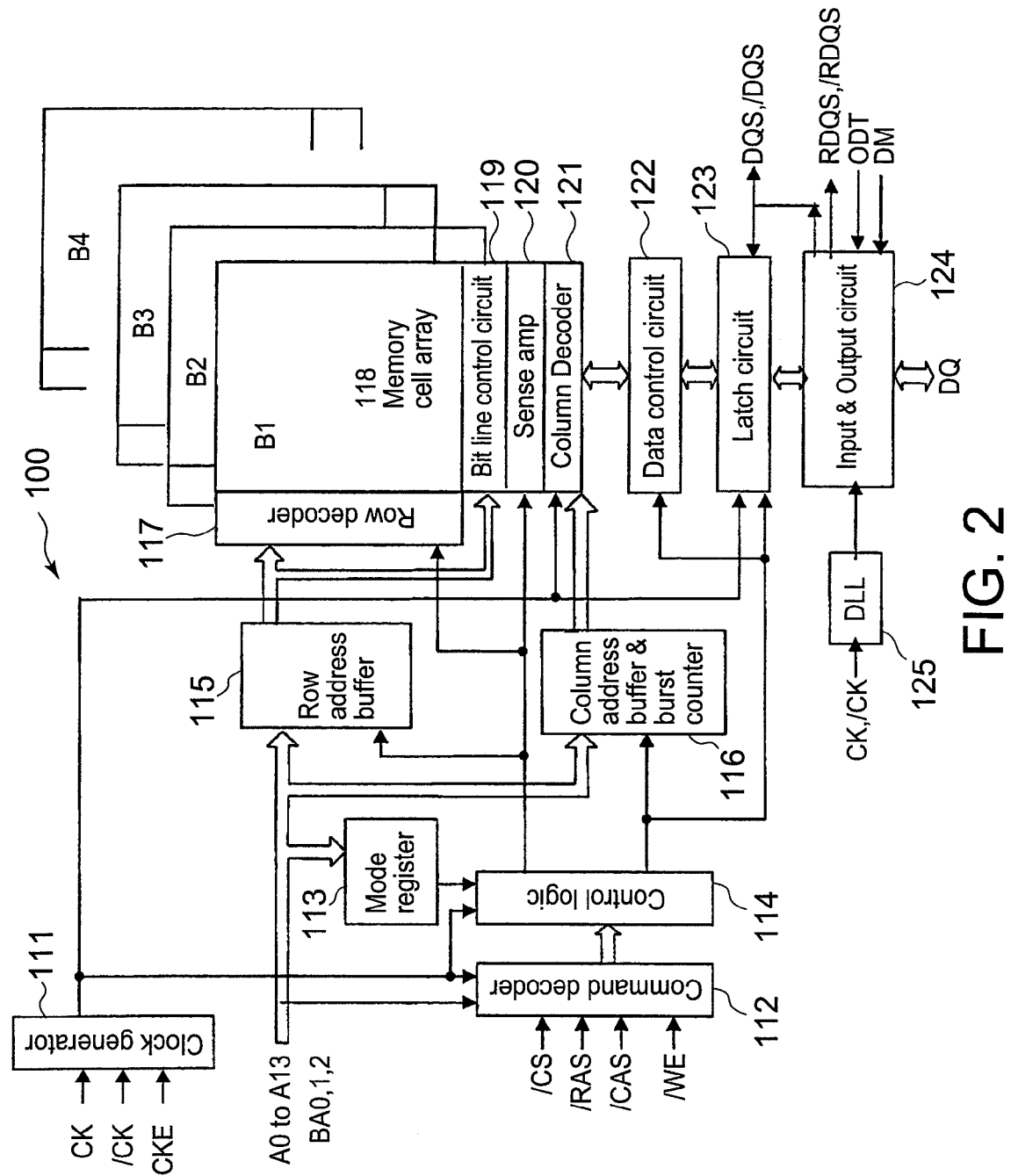
FIG. 2 is a block diagram illustrating a general structure of a semiconductor memory device to which this invention can be applied.

With reference to FIG. 2, a general structure diagram of a semiconductor memory device 100 is described. The semiconductor memory device 100 is supplied with clock, address, command, and data externally so that the general operation is controlled by those input signals. On the periphery of a memory cell array 118, there is a bank including a row decoder 117, a bit line control circuit 119, a sense amplifier 120, and a column decoder 121. The semiconductor memory device 100 illustrated in FIG. 2 has a four-bank structure including banks B1 to B4. Operations of the individual banks are identical with one another, and hence only one selected bank is described below.

The semiconductor memory device 100 includes, as input circuits, a clock generator 111 to which clock signals (CK, /CK, and CKE) are supplied, a command decoder 112 to which commands (/CS, /RAS, /CAS, and /WE) are supplied, a mode register 113, a row address buffer 115, a column address buffer/burst counter 116. As illustrated in FIG. 2, the mode register 113, the row address buffer 115, and the column address buffer/burst counter 116 are given addresses (A0 to A13 and bank address).

The internal clock generated in the clock generator 111 is delivered to the command decoder 112, a control logic 114, the column decoder 121, a latch circuit 123, and the like. The command decoder 112 is supplied with the commands (/CS, /RAS, /CAS, and /WE), and the output thereof is sent to the control logic 114. The mode register 113 is supplied with the address, the bank address signal, and the like and supplies the mode signal to the control logic 114. The control logic 114 is supplied with clock signals, addresses, and the output from the mode register 113, and delivers various control signals to the individual circuits. The row address buffer 115 receives the row address and outputs the same to the row decoder 117 and the bit line control circuit 119 in accordance with the control signal. The column address buffer and burst counter 116 receives the column address and outputs the same to the column decoder 121 in accordance with the control signal, and generates automatically continuous addresses in accordance with a burst length counted by the burst counter so as to output the same.

The row decoder 117 decodes the input address so as to select a word line of the memory cell array. Each memory cell array 118 includes a memory cell region in which a plurality of memory cells are arranged in matrix. The bit line control circuit 119 controls the initialization and the like of the bit line together with the bit line decoder for selecting the bit line. The sense amplifier 120 amplifies information from the memory cell that is selected by the row decoder 117 and is connected to the selected bit line by the bit line decoder. The column decoder 121 selects the sense amplifier that amplifies data from the memory cell, and the data is read out externally via a data control circuit 122, a latch circuit 123, and an input and output circuit 124. The cell data is read out continuously in accordance with the burst length that is set in this case.

In addition, when data is written in the semiconductor memory device, data DQ supplied to the input and output circuit 124 in the opposite direction to the reading case is written in the memory cell via the latch circuit 123 and the data control circuit 122. In addition, input and output operations of those data DQ are performed at high speed in synchronization with the clock. To this end, a DLL circuit 125 is generally connected to the input and output circuit 124 to perform timing adjustment.

With reference to FIGS. 3A, 3B, and 3C, description is made about a geometrical layout relationship of the semiconductor memory device to which this invention can be applied. FIG. 3A illustrates a chip structure of the semiconductor memory device according to this invention. In the illustrated example, four banks B1 to B4 are disposed in a chip, and a peripheral circuit P is disposed intensively in a middle portion of the banks B1 to B4. In addition, a lot of pads PAD are arranged on the rim of the banks B1 to B4.

In addition, each bank B is divided into a plurality of mats MAT to be a unit for storing information as illustrated in FIG. 3B, and various types of decoders, selectors, and the like are disposed on the periphery of the bank B as illustrated by the broken line. Further, in the example illustrated in FIG. 3C, each MAT includes four pages of cell arrays (PAGE1 to PAGE4), a bit line control circuit BLC, a sense amplifier selector SAS, a pair of sense amplifiers A and B disposed for each page of cell arrays (PAGE1 to PAGE4) (total four pairs of sense amplifiers), and a sub word line decoder (SWD). In addition, in FIG. 3C, a bit line decoder (BLD) and a bit line selector (BLS) are disposed outside the MAT.

It is to be noted that the structure of disposing the sense amplifiers A and B so as to be disposed side by side on an upper side of the page with respect to one page is described, but the sense amplifiers A and B may be disposed separately on the upper side and a lower side. In this case, the bit lines are arranged alternately, and two sets of bit line decoders, bit line selectors, and bit line control circuits are necessary on the upper and the lower sides.

Figure 4:
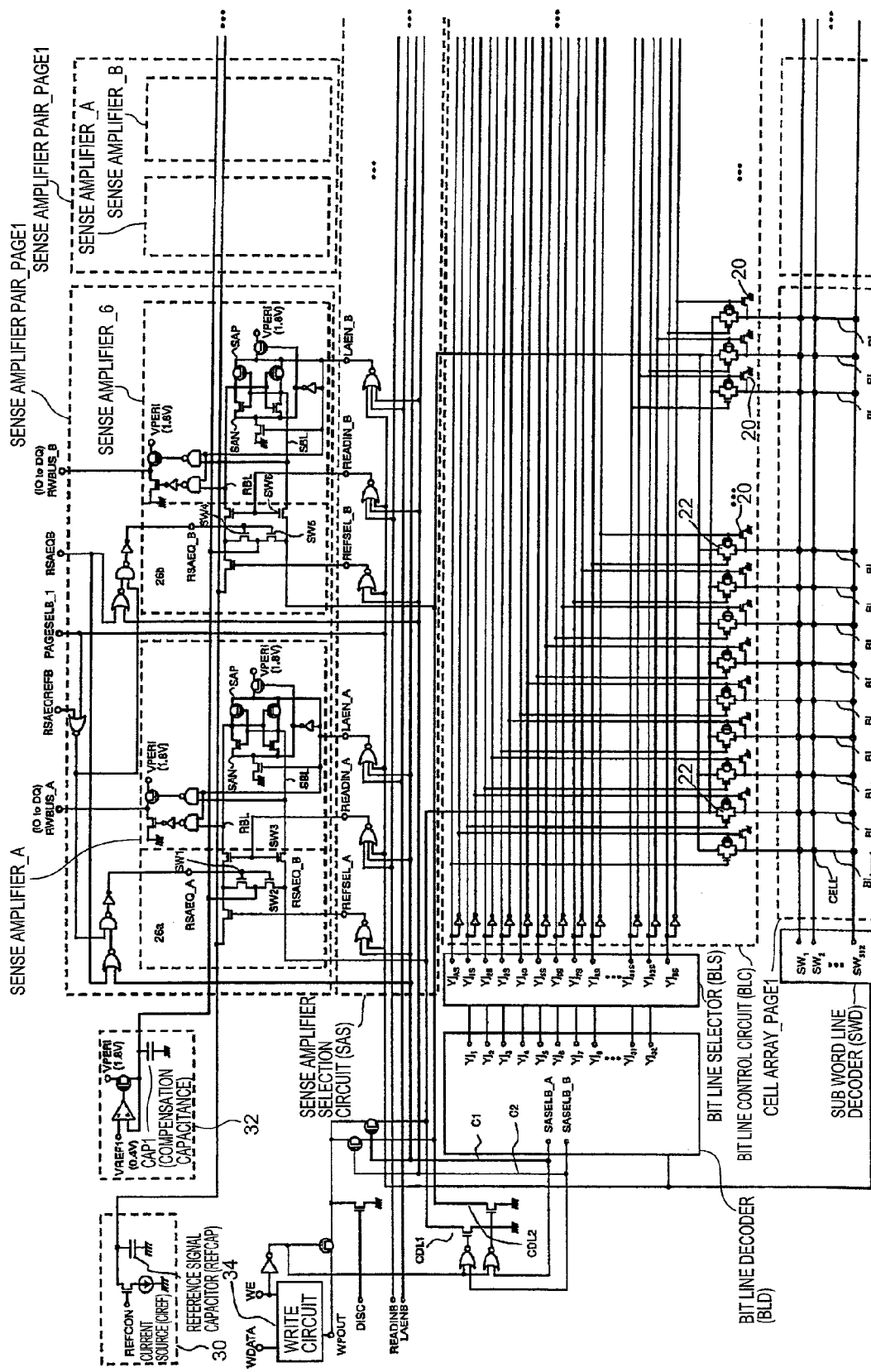
FIG. 4 is a circuit diagram illustrating a specific structure of the semiconductor memory device according to this invention.

With reference to FIG. 4, there is illustrated a structural example of the semiconductor memory device according to an example of this invention, in which the MAT illustrated in FIG. 3C is more specifically illustrated. In the example illustrated in FIG. 4, two pages of cell arrays PAGE1 and PAGE2 are illustrated. The individual cell arrays PAGE1 and PAGE2 are connected to the sub word lines SW1 to SW512 extending from the sub word line decoder SWD laterally in FIG. 4 and are also connected to bit lines BL1 to BL32 extending vertically in FIG. 4. In addition, in the illustrated example, dummy bit lines BLduumy1 and BLdummy2 are also disposed.

Here, the memory cell illustrated in FIG. 1A is disposed at each of intersections of the sub word lines SW1 to SW512 and the bit lines BL1 to BL32, BLdummy1, and BLdummy2.

The bit lines BL1 to BL32, BLdummy1, and BLdummy2 extending from the cell arrays PAGE1 and PAGE2 are connected to the bit line control circuit (BLC). Further, the bit line control circuit (BLC) is also connected to the bit line selector (BLS), and the bit line selector (BLS) is connected to the bit line decoder (BLD).

The bit line control circuit (BLC) includes the discharge circuit 20 including the discharge switch (transistor) for selectively charging and discharging the individual bit lines BL, and the selection switch circuit including the selection switch 22 formed of opposite conductive type transistors (CMOS transistors).

Further, a sense amplifier pair PAGE1 formed of the sense amplifiers A and B illustrated in FIG. 3C is disposed correspondingly to PAGE1. In the same manner, a sense amplifier pair PAGE2 formed of the sense amplifiers A and B corresponding to PAGE2 is also illustrated. Actually, in the same manner, sense amplifier pairs PAGE3 and PAGE4 are also disposed correspondingly to PAGE3 and PAGE4, but they are omitted for simplification here. The illustrated sense amplifiers A and B are respectively connected to first and second equalizer portions 26a and 26b constituting the equalizer circuit 26 illustrated in FIG. 1A.

A sense amplifier selection circuit (SAS) is disposed between the sense amplifier pair PAGE1, the equalizer portions 26a and 26b, and the bit line control circuit (BLC).

In addition, a reference signal generation circuit 30 and an equalizer voltage source 32 for generating the equalizer voltage VEQ are connected to the sense amplifier pair PAGE1.

Here, the individual sense amplifiers A and B of the sense amplifier pair PAGE1 includes not only the sense amplifiers but also a bit line connection transistor for the sense bit line and the reference bit line and a charging transistor. Each of the sense amplifiers A and B is formed of a flip-flop made of CMOS, and PMOS and NMOS circuits for supplying a high power supply voltage and a low power supply voltage to the flip-flop. The flip-flop is supplied with a high power supply voltage (SAP) and a low power supply voltage (SAN) by the sense amplifier enabling signal LAEN so as to amplify the data. The sense amplifier A or B amplifies a voltage difference between the sense bit line SBL on which data is read out from the memory cell and the reference bit line RBL and outputs the output thereof to a read bus RWBUS.

The bit line connection transistor for connecting the sense bit line SBL of the flip-flop of the sense amplifiers A and B with the reference bit line RBL is formed of NMOS and is turned on or off in accordance with a bit line connection signal READIN.

The first and the second equalizer portions 26a and 26b of the equalizer circuit 26 for charging the bit line include switches SW1 and SW2, or SW3 and SW4 that are formed by two NMOS transistors respectively connected to the bit line pair (SBL and RBL). A common connection node of the two NMOS transistors is connected to the equalizer voltage source 32, and the common connection node is supplied with a bit line charging high voltage of 0.4 V for example as the equalizer voltage VEQ. Gates of the two NMOS transistors are supplied with an equalize control signal RSAEQ so that each NMOS transistor is turned on, and the bit line pair (SBL and RBL) of the sense amplifiers A and B are charged to the same voltage.

The equalizer voltage source 32 for supplying the equalizer voltage VEQ works as a constant voltage source of 0.4 V for example and is connected to a compensation capacitance CAP1 for stabling the voltage. The bit line pair (RBL and SBL) are charged by the timing signals of equalize signals RSAEQ-A and RSAEQ-B.

Further, the illustrated first and second equalizer portions 26a and 26b include a pair of NMOS transistors connected to the bit line pair RBL and SBL respectively, and the pair of NMOS transistors constitute the switches SW3 and SW6 illustrated in FIG. 4. The gates of the pair of NMOS transistors are supplied with signals READIN_A and READIN_B.

The reference bit line RBL is connected to the reference signal generation circuit 30. The reference signal generation circuit 30 includes a capacitance for reference signal REFCAP, the reference constant current source CIREF, and a switching transistor for connecting the reference constant current source CIREF with the reference bit line RBL. The capacitance for reference signal REFCAP is connected between the reference bit line and the ground voltage, and is a capacitance corresponding to a capacitance of structural elements connected to the sense bit lines including the selected bit line. The reference constant current source CIREF is a constant current source for supplying constant current corresponding to an intermediate value between high resistance and low resistance of the memory element of the memory cell. In this case, the reference bit line is common to a plurality of sense amplifiers. Therefore, if K sense amplifiers are connected for example, K times of constant current should be supplied. However, the constant current may be reduced in accordance with by contraction conversion to the same ratio as a capacitance value of the capacitance for reference signal REFCAP.

The switching transistor is disposed between the reference bit line RBL and the reference constant current source CIREF. The switching transistor is turned on when the memory cell data is read, and hence a voltage of the reference bit line RBL is lowered by the reference constant current source CIREF. In this way, the reference bit line RBL works in the same manner as the sense bit line SBL that changes in accordance with information read from the memory cell, and hence a differential voltage can be supplied to the sense amplifier.

On the other hand, the sense bit line SBL is connected to a write circuit portion for writing data. The write circuit portion includes a write circuit 34, an inverter circuit for inverting a write enable signal WE which is supplied together with write data WDATA when the writing operation is performed, a PMOS transistor which is turned on by the inverted write enable signal, and two NOR circuits which work when receiving the inverted write enable signal.

Next, the bit line decoder (BLD) connected to the write circuit portion receives row address (ROW) from an address register (not shown) and outputs bit line selection signals Yj1 to Yj32, and also outputs sense amplifier selection signals SASELB_A and SASELB_B selectively. The sense amplifier selection signals SASELB_A and SASELB_B are used for selecting the sense amplifier A or B.

Figures 5A, 5B:
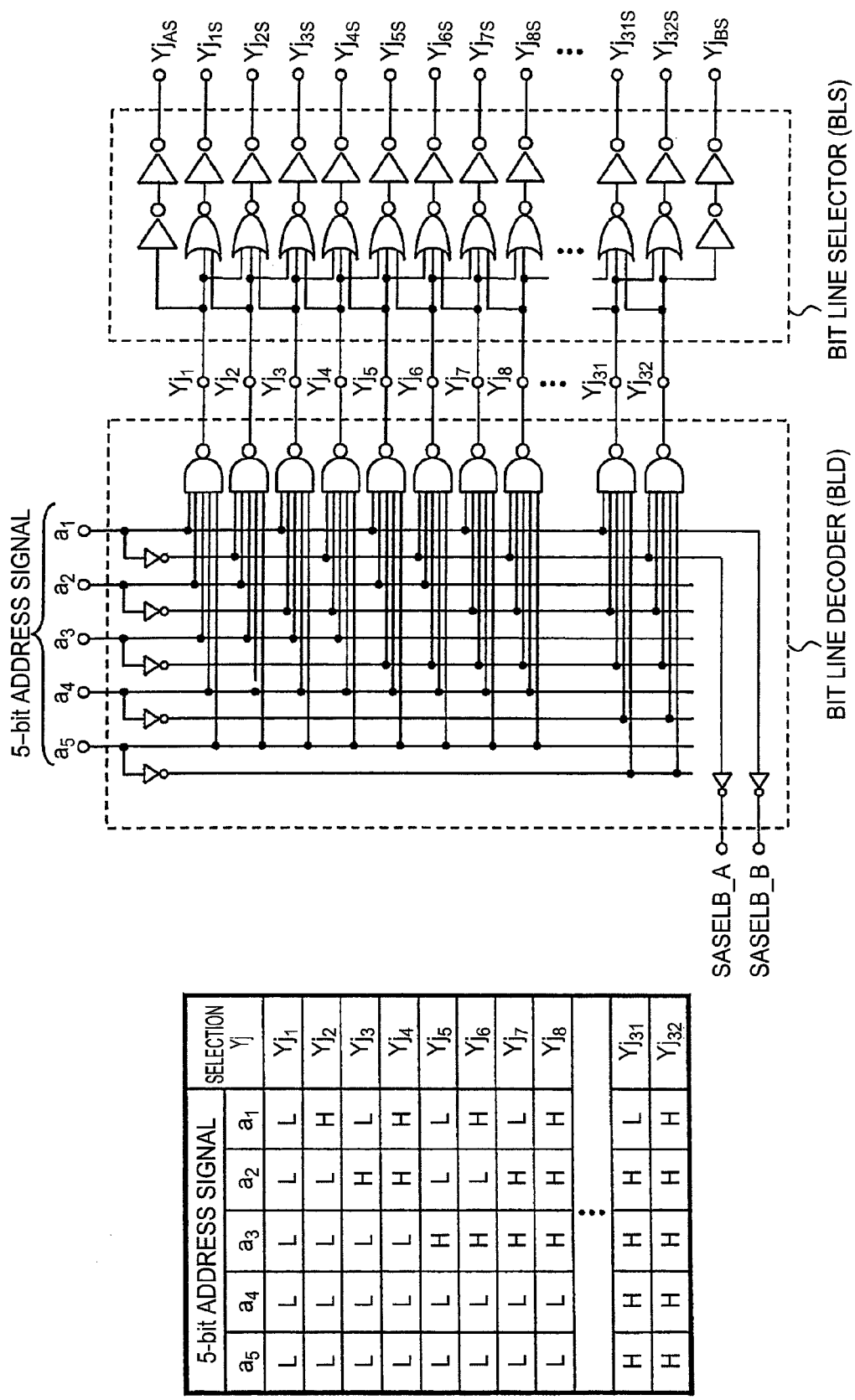
FIG. 5A is a circuit diagram illustrating a bit line decoder (BLD) and a bit line selector (BLS) illustrated in FIG. 4.
FIG. 5B is a truth table of the bit line decoder (BLD)

With reference to FIGS. 5A and 5B, there are respectively illustrated specific circuit examples of the bit line decoder (BLD) and the bit line selector (BLS), and a truth table of the bit line decoder (BLD).

The bit line decoder (BLD) illustrated in FIG. 5A is provided with the address signal having five bits (a1 to a5). The address signal a1 is output as a sense amplifier selection signal SASELB_A for selecting a sense amplifier A via two inverters, while the address signal a1 is output as a sense amplifier selection signal SASELB_B for selecting a sense amplifier B via a single inverter.

Further, the address signal a1 is supplied to the odd numbered NAND gate directly and is supplied to the even numbered NAND gate via the inverter. In the same manner, each of the address signals a2, a3, a4, and a5 is supplied to the odd numbered NAND gate directly and is supplied to the even numbered NAND gate via the inverter.

As a result, the bit line decoder (BLD) outputs column selection signals Yj1 to Yj32 in accordance with the truth table illustrated in FIG. 5B.

In the bit line selector (BLS) according to this invention, when the selected bit line BL is selected by the column selection signals Yj1 to Yj32, the unselected bit lines adjacent to the selected bit line BL are also selected. Therefore, a NOR gate for a NOR operation between the individual column selection signals Yj1 to Yj32 and the two adjacent column selection signals, and an inverter for inverting an output signal of each NOR gate are disposed. Further, considering the case where the adjacent unselected bit line exists on only one side as each of the column selection signals Yj1 and Yj32, a circuit for outputting the column selection signal Yj1 or Yj32 via two inverters is disposed. As a result, the bit line selector (BLS) outputs the column selection signals YjAS and Yj2S on both sides of the column selection signal Yj1S. In the same manner hereinafter, the column selection signal is output to the unselected bit lines on both sides of the selected bit line.

With reference to FIG. 4 again, the sense amplifier selection signals SASEL_A and SASEL_B from the bit line decoder (BLD) are supplied to the gate of the NMOS transistor via the NOR gate to which the inverted write enable signal WE is supplied. The source of each NMOS transistor is connected to the ground while the drain thereof is connected to charge and discharge lines CDL1 and CDL2 corresponding to the first and second equalizer power supply lines 241 and 242 illustrated in FIG. 1. The charge and discharge line CDL1 is connected to every other switch disposed in the bit line control circuit (BLC) while the charge and discharge line CDL2 is connected to remaining switches in the bit line control circuit (BLC). When the write enable signal WE is supplied, i.e., when the write operation is performed, the NMOS transistor is turned on so that the charge and discharge lines CDL1 and CDL2 are connected to the ground. In the read operation, in contrast, the NMOS transistor is turned off. Therefore, in the read operation, the charge and discharge lines CDL1 and CDL2 are supplied with the equalizer voltage VEQ from the equalizer voltage source 32.

In addition, the charge and discharge lines CDL1 and CDL2 are connected to PMOS transistors that are switched by receiving sense amplifier selection signals SASELB_A and SASEL_B. The charge and discharge lines CDL1 and CDL2 are supplied with a WPOUT signal from the PMOS transistor in the write operation.

Further, the charge and discharge line CDL1 is connected to the sense bit line SBL of the sense amplifier A via a switch SW3 formed of an NMOS transistor. On the other hand, the charge and discharge line CDL2 is connected to the sense bit line SBL of the sense amplifier B via a switch SW6 formed of an NMOS transistor. Therefore, a result of charge and discharge of the selected memory cell is supplied to the sense bit line SBL of the individual sense amplifiers A and B.

In the illustrated example, further, the sense amplifier selection signals SASELB_A and SASEL_B are output to the control signal lines C1 and C2, respectively. The control signal line C1 is connected to three NOR gates disposed correspondingly to the sense amplifier A among the sense amplifier selection circuit SAS and is used for supplying a reference selection signal REFSEL_A, a bit line selection signal READIN_A, and a sense amplifier enabling signal LAEN_A from the individual NOR gates to the sense amplifier. On the other hand, the control signal line C2 is connected to three NOR gates disposed correspondingly to the sense amplifier A among the sense amplifier selection circuit SAS and is used for supplying REFSEL_B, READIN_B, and LAEN_B from the individual NOR gates to the sense amplifier.

Here, a page select signal PAGESELB_1 is supplied to the NOR gate for generating REFSEL_A and REFSEL_B, and a page select signal PAGESELB_1 and a READINB signal are supplied to the NOR gate for generating READIN_A and READIN_B. In addition, a LAENB signal is further supplied to the NOR gate for generating LAEN_A and LAEN_B.

Next, operations of the sense amplifiers A and B of the bit line control circuit (BLC) and the equalizer voltage source 32 are described.

Receiving one of the column selection signals Yj1 to Yj32 from the bit line decoder (BLD), the bit line selector (BLS) selects the bit line by the column selection signals Yj1 to Yj32 and puts the unselected bit lines adjacent to the selected bit line into the selected state.

When the equalize operation is performed, the charge and discharge lines CDL1 and CDL2 are both disconnected from the ground by the SASELB_A and SASELB_B, and the charge and discharge lines CDL1 and CDL2 are connected to the equalizer voltage source 32.

Therefore, in the bit line control circuit (BLC), the equalizer voltage VEQ from the equalizer voltage source 32 is supplied to the selected column selection switch 22 via one of the selected charge and discharge lines CDL1 and CDL2, and is supplied to the other column selection switch via the other of the charge and discharge lines CDL1 and CDL2 to the adjacent column switch.

Further, each of the sense amplifiers A and B is connected to the sense amplifier selection circuit SAS. The sense amplifier selection circuit SAS includes a NOR gate for outputting a reference selection signal REFSEL_A, a bit line connection signal READIN_A, and a sense amplifier enabling signal LAEN_A to the sense amplifier A, and a NOR gate for outputting a reference selection signal REFSEL_B, a bit line connection signal READIN_B, and a sense amplifier enabling signal LAEN_B to the sense amplifier B.

Each of the sense amplifiers A and B includes a sense amplifier portion formed of a flip-flop connected between the sense bit line SBL and the reference bit line RBL, and is connected to first and second equalizer portions 26a and 26b for supplying the equalizer voltage from the equalizer voltage source 32 to the sense amplifiers A and B selectively.

Specifically, the first and second equalizer portions 26a and 26b include switches (SW1 and SW2 or SW4 and SW5) formed of two NMOS transistors for supplying selectively to the bit line control circuit (BLC), and a switch (SW3 or SW6) formed of three NMOS transistors which receives REFSLE_A and REFSLE_B and READIN_A and READIN_B from the sense amplifier selection circuit SAS and supplies the reference voltage from the reference voltage generation circuit 30 selectively to the sense amplifier portion.

On the other hand, the sense amplifiers A and B include an inverter and a switch portion which receive LAEN_A and LAEN_B and make the sense amplifier portion be in an active state. Among them, the sense amplifier portion is formed of a CMOS circuit connected to the high power supply voltage (SAP) and the low power supply voltage (SAN).

The output of the sense amplifier portion is output to RWBUS_A via a logic circuit as a data signal DQ.

With reference to waveform diagrams illustrated in FIGS. 6 to 9, an operation of the semiconductor memory device illustrated in FIG. 4 is described.

Note that the waveform diagrams illustrated in FIGS. 6 to 9 are the same waveform diagram, but they are divided into a plurality of diagrams for clarifying the operational sequence.

Figure 6:
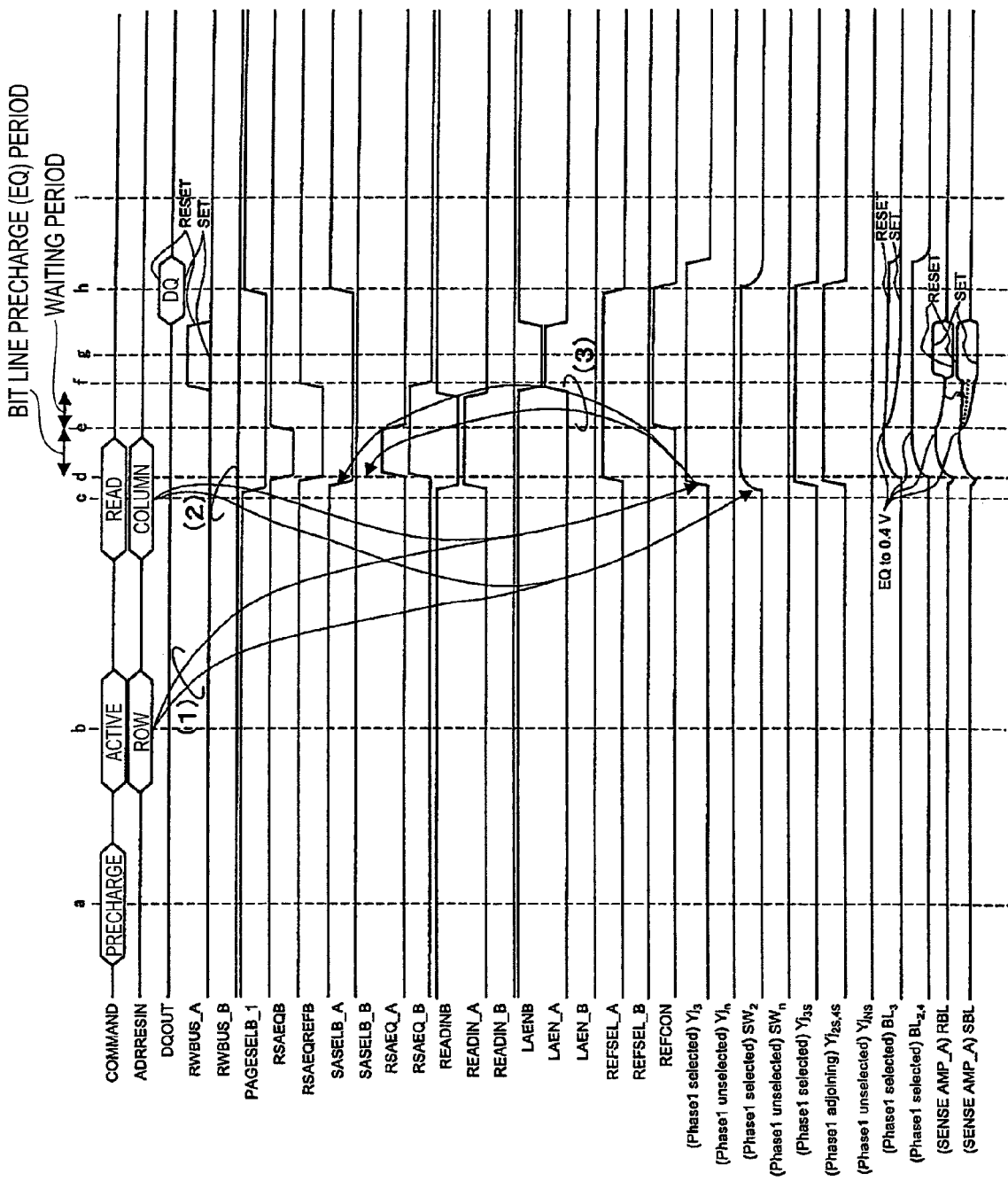
FIG. 6 is a waveform diagram for describing a part of an operation of the semiconductor memory device illustrated in FIG. 4.

In FIG. 6, as illustrated in a command line (COMMAND), PRECHARGE is performed at timing "a". After the PRECHARGE, row address (ROW) is supplied at timing b of an ACTIVE command.

When the row address is supplied, as illustrated by (1) in FIG. 6, Yj address and sub word (SW) address are fixed. In the waveform diagram illustrated in FIG. 6, Yj3 and SW2 are selected. Next, at timing c, COLUMN address is supplied so that mat and page (PAGE) selected in the bank are fixed. Here, it is supposed that PAGE1 is selected.

Thus, PAGESELB_1 is enabled, and the bit line decoder (BLD) and the sub word line decoder (SWD) are operated by PAGESELB_1 so that only Yj and SW signals of the selected PAGE (or MAT) are raised (2). In the illustrated example, Yj3 and SW2 address lines change from low level to high level, while the unselected SWn address line remains at low level.

Next, the sense amplifier selection signals (SASELB_A and SASELB_B) are output from the bit line decoder (BLD) (3). In this example, the sense amplifier selection signal SASELB_A is enabled while the sense amplifier selection signal SASELB_B is not enabled.

Figure 7:
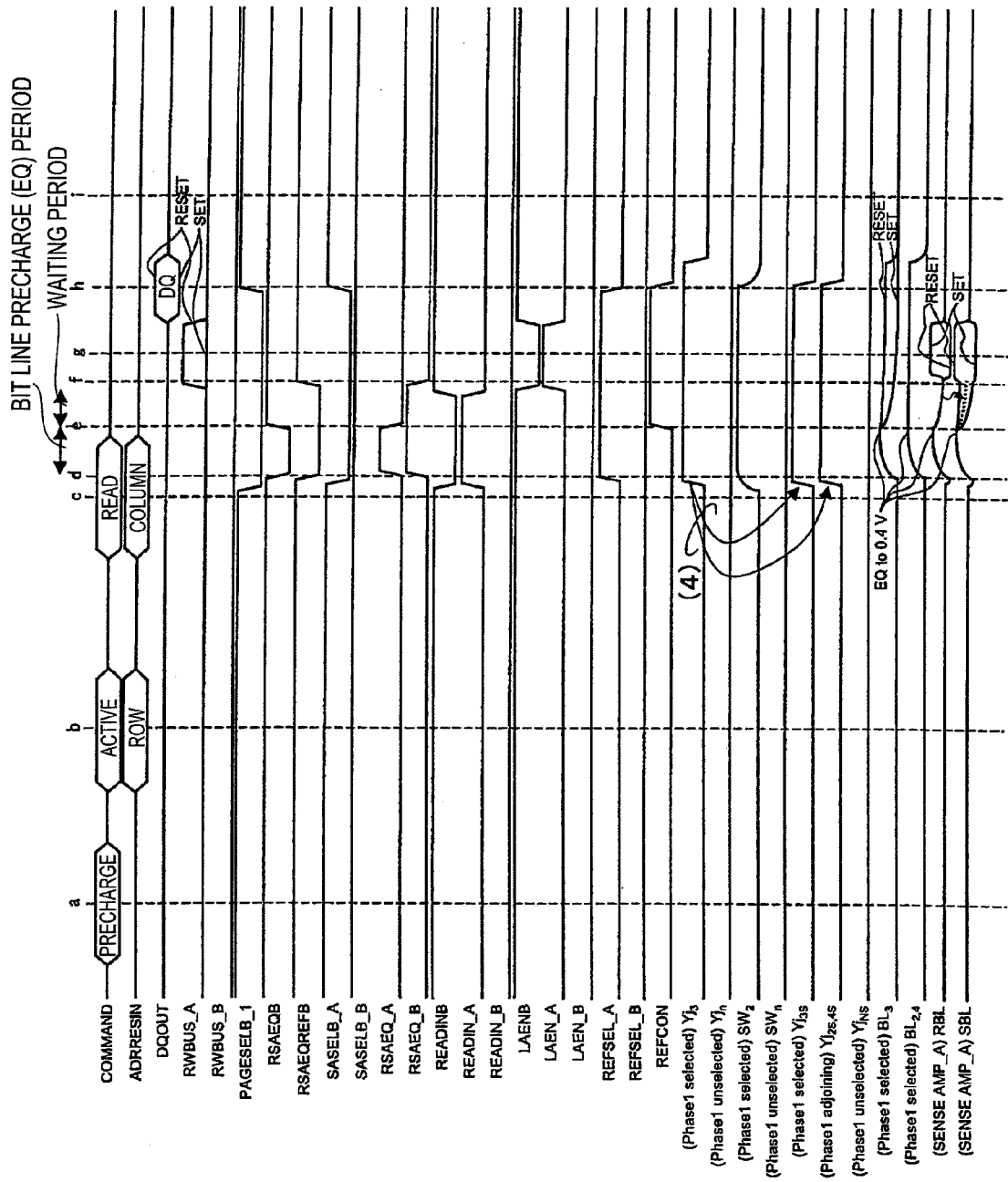
FIG. 7 is a waveform diagram for describing an operation performed after the operation illustrated in FIG. 6.

Next, as illustrated by (4) in FIG. 7, the Yj address output from the bit line decoder (BLD) passes through the bit line selector (BLS) so that the selected bit line control signal Yj3S and the control signals Yj2S and Yj4S for selecting the adjacent bit line are raised.

Figure 8:
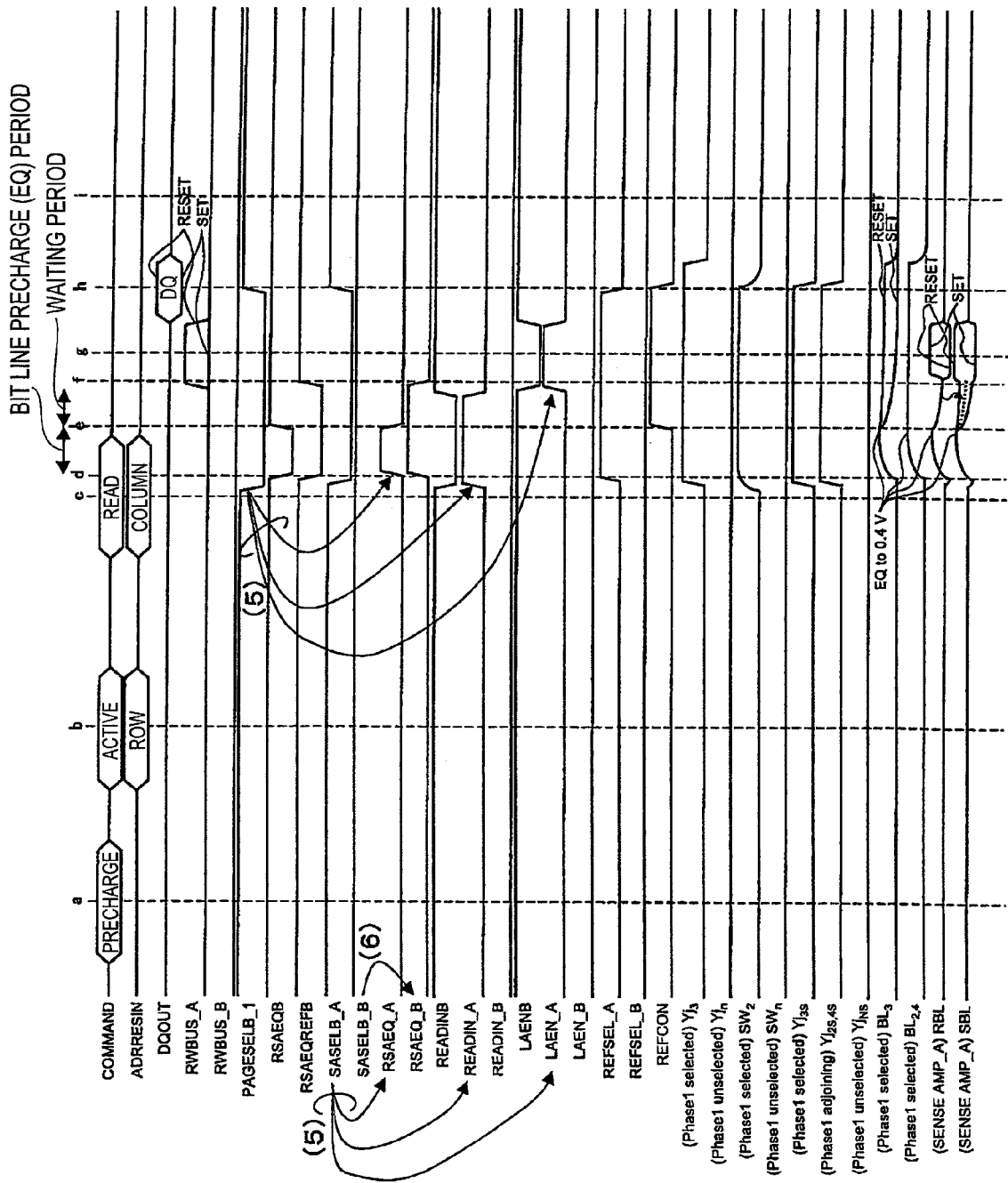
FIG. 8 is a waveform diagram for describing an operation performed after the operation illustrated in FIG. 7.

Next, the PAGE selection signal (PAGESELB_1 in the illustrated example) supplies the timing signals (RSAEQ_A, READIN_A, and LAEN_A) for equalizing and reading only to the sense amplifier selected by the sense amplifier selection signal (SASELB_A) among the sense amplifiers in the selected PAGE as illustrated by (5) in FIG. 8.

In this case, the unselected sense amplifier is supplied with the timing signal RSAEQ_B for equalizing the adjacent bit line as illustrated by (6) in FIG. 8. In this case, SWL is raised during the equalizing operation, and hence the selected cell is discharged, but the supplied charge quantity from the power supply and the driver is set larger than the discharged charge quantity so that the bit line is charged to the charged potential in a forced manner. In this case, SWL may be raised after equalizing is finished or at the same time as or before the equalizing starts like in this example.

Figure 9:
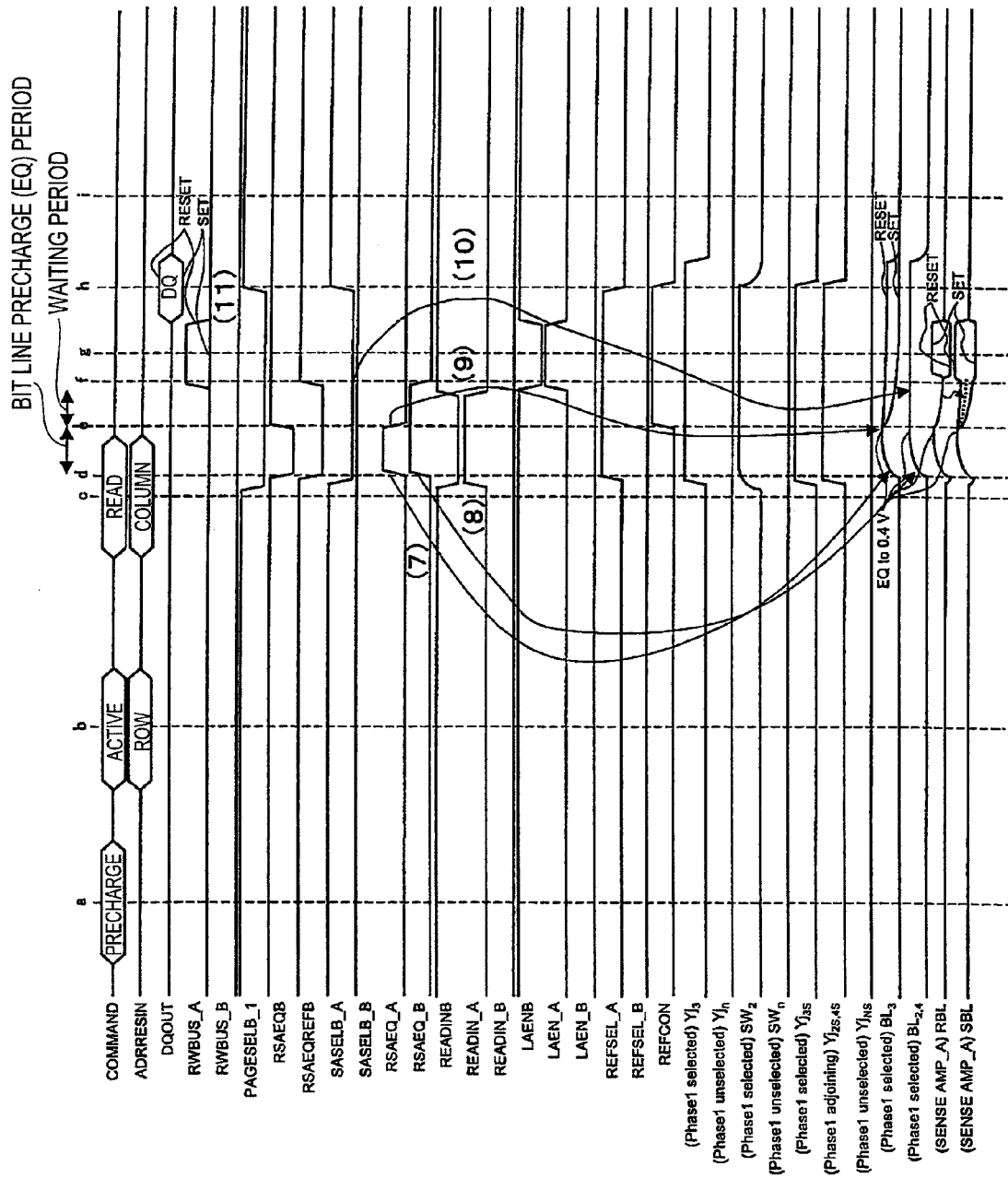
FIG. 9 is a waveform diagram for describing an operation performed after the operation illustrated in FIG. 8.

Further, as illustrated by (7) in FIG. 9, the selected bit line is charged by the timing signal described above, and the adjacent bit lines are also charged as illustrated by (8). In this case, the adjacent bit lines are charged to 0.4 V, for example.

Next, after the charging operation is completed, RSAEQ_A becomes disabled, and the bit line becomes the discharging state from the selected cell (sensing operation) as illustrated by (9) in FIG. 9. In this case, the adjacent bit line is also discharged by the word line WL from the selected cell. However, because RSAEQ_B is the signal corresponding to RSAEQREFB, the constant voltage is supplied from the equalizer power supply during the discharge of the selected bit line as illustrated by (10) in FIG. 9. Therefore, the adjacent bit line is maintained to be a constant potential of 0.4 V.

An operation of the sense amplifier from the signals of the RBL and SBL nodes are latched after that until they are output to RWBUS_A is described.

The sense bit line SBL and the reference bit line RBL are discharged by the selected memory cell and the constant current source CIREF, and hence voltages thereof are lowered. When the sense bit line SBL and the reference bit line RBL causes a voltage difference of 100 mV or higher for example, the bit line connection signal READIN is disabled (LOW). As a result, the sense amplifier is disconnected from the bit line pair (SBL and RBL).

In this case, the bit line connection signal READIN_A is disabled (LOW) so that a voltage difference between the sense bit line SBL and the reference bit line RBL is fixed.

Next, the sense amplifier enabling signal RAENB is enabled (HIGH), and hence the sense amplifier is supplied with the high power supply voltage SAP and the low power supply voltage SAN. When the power supply voltages are supplied, the sense amplifier amplifies a voltage difference between the first bit (sense bit) line and the second bit (reference bit) line. Thus, the output of the sense amplifier becomes a full amplitude output of the ground voltage or the power supply voltage in accordance with the resistance state of the selected memory cell which is high resistance (reset) or low resistance (set). At this time point, the bit line pair (SBL and RBL) is disconnected from the sense amplifier and is kept in the intermediate voltage.

As an actual operation in this decision period, the sense amplifier performs a full amplitude operation between the ground voltage and the power supply voltage, and the bit line pair (SBL and RBL) performs an intermediate voltage operation that is smaller than the voltage between the ground voltage and the power supply voltage.

The amplified data signal is output to the read bus RWBUS_A as illustrated by (11). HIGH level or LOW level is output on the read bus RWBUS_A in accordance with the high resistance state or the low resistance state of the selected memory cell. Next, output data of RWBUS_A is transferred to DQ output.

Next, a READ command and column address are supplied. The cell information of the address designated by the input column address and burst counter among cell information output from each sense amplifier to the read bus RWBUS is output continuously from the input and output circuit.

Figure 10:
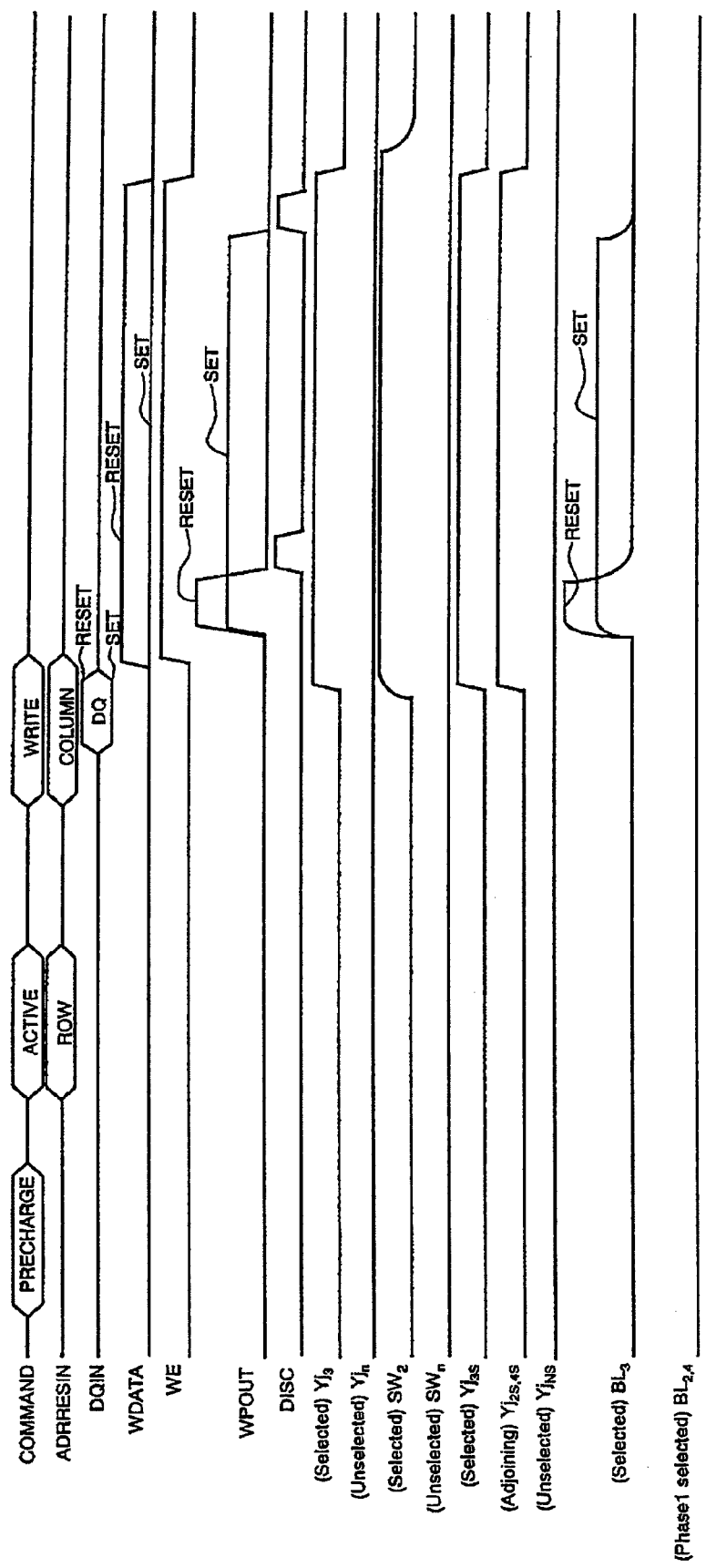
FIG. 10 is a waveform diagram for describing a write operation in the semiconductor memory device illustrated in FIG. 4.

Next, with reference to FIGS. 4 and 10, a write operation of the semiconductor memory device according to this invention is described.

In the same manner as the case of the read operation, following a PRECHARGE command, an ACTIVE command is received and a ROW address is supplied. Then, the Yj address and the SW address are fixed. Here, it is supposed that Yj3 address and SW2 are selected.

Next, by the input of the WRITE command and the input of the column address, write operation of the data DQ is started. As illustrated in FIG. 4, the write circuit 34 is supplied with WDATA and the write enable signal WE, the write enable signal WE is inverted by the inverter, and then NOR operation is performed between SASEL_A and SASEL_B. As a result, one of the charge and discharge lines CDL1 and CDL2 are put into the grounded state. Therefore, an output WOUT of the write circuit 34 is supplied only to the bit line (BL3) connected to the non-grounded charge and discharge line among the charge and discharge lines, and the adjacent bit lines (BL2 and BL4) are connected to the ground.

The output WOUT of the write circuit 34 is stored sequentially in the memory cells corresponding to the column address in each page in accordance with SASEL_A and SASEL_B. Here, the sense amplifiers A and B are switched by SASEL_A and SASEL_B for each bit in each page while the write operation is performed.

Note that in this example, there is disclosed the equalizer in which at least three bit lines including the selected bit line and two unselected bit lines adjacent to the selected bit line on both sides of the selected bit line are changed to a predetermined voltage (VEQ), and the two unselected bit lines adjacent to the selected bit line on both sides of the selected bit line are kept to be the predetermined voltage during the sensing operation of the selected bit line. However, the control of the adjacent bit lines may be performed for four or more bit lines adjacent to the selected bit line.

Industrial applicability of this invention is described.

For instance, embodiments of this invention disclose the case where the bit line is discharged by a resistance difference corresponding to memory cell information, but the basic technical concept of this invention is not limited to this structure. For instance, it is possible to adopt the opposite charge and discharge relationship (method of charging the bit line base on a resistance difference corresponding to the memory cell information). A skilled person in the art can understand the structure easily by the basic technical concept of the present application.

Although the semiconductor memory device has thus far been described as the embodiments, this invention is applicable to a semiconductor device and a semiconductor system formed by a wide variety of logic devices including memory cells. In other words, the basic technical concept of this invention can be applied to various semiconductor devices which are not restricted to a dedicated memory apparatus exclusively used. For example, this invention is applicable to a general semiconductor device, such as a CPU (Central Processing Unit), an MCU (Micro Contral Unit), a DSP (Digital Signal Processor), an ASIC (Application Specific Integrated Circuit), an ASSP (Application Specific Standard Circuit) and the like each of which includes a plurality of memory elements or cells for a memory function. This invention may be applied to semiconductor devices which take various types and packages of products, such as an SOC (System On Chip), an MCP (Multi-Chip Package), a POP (Package On Package), and so on. The structure of the voltage differential amplifier circuit can be any structure.

In addition, it is sufficient that the transistor is a field effect transistor (FET), which may be various types including a metal oxide semiconductor (MOS), a metal-insulator semiconductor (MIS) transistor, a thin film transistor (TFT), and the like. It may be a bipolar transistor. Further, the NMOS transistor (N-channel MOS transistor) is a typical example of the first conductive type transistor, and the PMOS transistor (P-channel MOS transistor) is a typical example of the second conductive type transistor.

In addition, this invention is useful not only for the nonvolatile memory device in which the resistance value is different depending on stored information but also for the nonvolatile memory device in which ON resistance (continuity resistance) of a transistor varies in accordance with stored information. Further, this invention is useful also for a logic device or an MCU in which memory cells are mounted in a mixed manner. It is needless to say that this invention is useful not only for a memory system but also for a general semiconductor system.

In addition, the disclosed elements can be combined or selected variously within the scope of the claims of this invention. In other words, as a matter of course, this invention includes all of the disclosure including the claims and various modifications and corrections which can be easily performed in accordance with the technical concept by a skilled person in the art.

Hereinafter, embodiments of this invention are listed.

According to a first embodiment of this invention, there is provided a semiconductor memory device, comprising: a plurality of memory cells each including a memory element for storing information by a resistance difference; bit lines which are connected to the plurality of memory cells, respectively;

a selection circuit for selecting the bit lines based on an address so as to connect the selected bit line to bit lines laid on a sense amplifier side; a first sense amplifier connected to the bit lines on the sense amplifier side; a second sense amplifier which is controlled in a manner different from the first sense amplifier; a first circuit which performs a control operation to put the bit line into a first potential; and a second circuit which performs a control operation to put the bit lines into a second potential, wherein:

the selection circuit selects a selected bit line to which the memory cell as an access target is connected and selects unselected bit lines placed on both sides of the selected bit line, and wherein:

the second circuit includes:

a first switch circuit which connects an equalizer voltage source for supplying the second potential, to the selected bit line on a side of the first sense amplifier so as to charge the selected bit line from the first potential to the second potential, and which disconnects the equalizer voltage source from the selected bit line on the side of the first sense amplifier after the charging; and a second switch circuit which connects the equalizer voltage source to the unselected bit lines so as to charge both the unselected bit lines from the first potential to the second potential, and which maintains each connection state between the equalizer voltage source and the unselected bit lines on a side of the second sense amplifier even after the disconnection of the first switch circuit.

According to a second embodiment of this invention, there is provided a semiconductor memory device according to the first embodiment, wherein the memory cells each further include an access transistor which connects the memory element to the bit line.

According to a third embodiment of this invention, there is provided a semiconductor memory device according to the first embodiment, wherein each of the first switch circuit and the second switch circuit includes:

a first terminal which is connected to the bit line on the side of the sense amplifier;

a second terminal which is connected to a reference voltage to provide a sense reference of each of the first sense amplifier and the second sense amplifier;

an intermediate terminal which is disposed between the first terminal and the second terminal and which is connected to the equalizer voltage source;

a first switch disposed between the first terminal and the intermediate terminal; and a second switch disposed between the intermediate terminal and the second terminal.

According to a fourth embodiment of this invention, there is provided a semiconductor memory device according to the third embodiment, wherein the first switch circuit turns off the first switch and the second switch after the selected bit line is charged, so as to disconnect the equalizer voltage source from the selected bit line on the side of the first sense amplifier, and wherein, after the unselected bit lines are charged, the second switch circuit turns on the first switch and turns off the second switch, so as to maintain the equalizer voltage source in states connected to the unselected bit lines on the side of the second sense amplifier.

According to a fifth embodiment of this invention, there is provided a semiconductor memory device according to the first embodiment, wherein:

the selection circuit includes a decoder which receives an address signal to output a selection signal which selects the selected bit line together with adjacent bit lines which are adjacent to the selected bit line and which are the unselected bit lines.

According to a sixth embodiment of this invention, there is provided a semiconductor memory device according to the fifth embodiment, wherein the decoder selects two bit lines disposed physically on both sides of the selected bit line as the adjacent bit lines.

According to a seventh embodiment of this invention, there is provided a semiconductor memory device according to the sixth embodiment, further comprising:

a memory array connected to the plurality of the bit lines which are made to correspond to each address on a system and which are extended in a predetermined direction; and dummy bit lines each connected to a dummy cell to which an address on the system is not made to correspond, each dummy bit line being disposed outside each edge position with respect to the selected bit line disposed at each edge position of the memory array, wherein each dummy bit line acts as the adjacent bit line.

According to an eighth embodiment of this invention, there is provided a semiconductor memory device according to the fifth embodiment, wherein the selection signal is further given to the first circuit.

According to a ninth embodiment of this invention, there is provided a semiconductor memory device according to the first embodiment, wherein, on a read operation, the selection circuit selects, by the use of a word line, a first memory cell connected to the selected bit line and second memory cells connected to the unselected bit lines.

According to a tenth embodiment of this invention, there is provided a semiconductor memory device according to the first embodiment, wherein the selection circuit selects only the selected bit line on a write operation.

According to an eleventh embodiment of this invention, there is provided a semiconductor memory device, comprising:

a plurality of bit lines connected to a plurality of memory cells, respectively;

a first circuit which connects the plurality of bit lines to a first potential;

a second circuit which connects the plurality of bit lines to a second potential; and sense amplifiers, wherein, when an access operation to the memory cell is started, the second circuit controls a selected bit line and adjacent bit lines physically adjacent to the selected bit line on both sides of the selected bit line to change from the first potential to the second potential, and then stops supplying the second potential to the selected bit line so that a potential of the selected bit line changes in accordance with information of a selected one of the memory cells, with the adjacent bit lines kept at the second potential, and wherein each sense amplifier performs a sensing operation of reading the information of the memory cell connected to the selected bit line during a period when the adjacent bit lines are kept at the second potential.

According to a twelfth embodiment of this invention, there is provided a semiconductor memory device, comprising:

a plurality of memory cells each including a memory element which stores information by the use of a resistance difference;

a plurality of bit lines connected to the plurality of memory cells, respectively;

a selection circuit which selects a predetermined number of bit lines from the plurality of bit lines so as to connect the selected bit lines to the corresponding bit lines on a side of the sense amplifiers; and an equalizer circuit connected to each of the bit lines on the side of the sense amplifiers, wherein the equalizer circuit includes:

an equalizer which changes, from a first potential to a second potential via the selection circuit, at least three bit lines which include the selected bit line that is equal to a predetermined number of bit lines and two unselected bit lines adjacent to the selected bit line on both sides of the selected bit line the two unselected bit lines adjacent to the selected bit line on the both sides of the selected bit line being kept at the second potential while the selected bit line is sensed.

According to a thirteenth embodiment of this invention, there is provided a semiconductor memory device according to the twelfth embodiment, further comprising sense amplifiers which are connected to the individual bit lines on the side of the sense amplifiers and are controlled in a manner different from each other.

According to a fourteenth embodiment of this invention, there is provided a semiconductor memory device according to the thirteenth embodiment, wherein the equalizer circuit includes a first circuit element which provides the second potential to the selected bit line, and a second circuit element which provides the second potential to the unselected bit lines.

According to a fifteenth embodiment of this invention, there is provided a semiconductor memory device according to the fourteenth embodiment, wherein the first circuit element is disconnected from the bit line on the side of the sense amplifiers after the second potential is applied, while the second circuit element is kept at states connected to the bit lines on the side of the sense amplifiers after the second potential is applied.

According to a sixteenth embodiment of this invention, there is provided a device, comprising the semiconductor memory device claimed in either one of the first, the eleventh, and the twelfth embodiments.

At any rate, it is apparent that this invention is not limited to the above embodiments, but may be modified and changed without departing from the scope and spirit of this invention.

What is claimed is:
1. A device comprising:
a plurality of bit lines each extending in a first direction, the bit lines being arranged substantially in parallel to one another in a second direction crossing the first direction so that the bit lines include odd-numbered bit lines and even-numbered bit lines in the second direction;

a plurality of memory elements each coupled to an associated one of the odd-numbered and even-numbered bit lines;

a reference line;

a first sense amplifier including first and second input terminals, the second input terminal being coupled to the reference line;

a second sense amplifier including third and fourth input terminals, the fourth input terminal being coupled to the reference line;

a plurality of first switches each including first and second nodes, the first nodes of the first switches being coupled in common to the first input terminal of the first sense amplifier, and the second nodes of the first switches being coupled to the odd-numbered bit lines, respectively;

a plurality of second switches each including third and fourth nodes, the third nodes of the second switches being coupled in common to the third input terminal of the second sense amplifier, and the fourth nodes of the second switches being coupled to the even-numbered bit lines, respectively;

a voltage line;

a third switch coupled between the voltage line and the first input terminal of the first sense amplifier; and a fourth switch coupled between the voltage line and the third input terminal of the second sense amplifier.

2. The device as claimed in claim 1, wherein the third switch is coupled between the voltage line and the first input terminal of the first sense amplifier without an intervention of any one of the first switches, and the fourth switch is coupled between the voltage line and the third input terminal of the second sense amplifier without an intervention of any one of the second switches.

3. The device as claimed in claim 1,
wherein the first sense amplifier is supplied at the first input terminal with a voltage on the voltage line when the third switch is turned ON, and each of the odd-numbered bit lines is supplied with the voltage on the voltage line when the third switch and an associated one of the first switches are turned ON, and wherein the second sense amplifier is supplied at the third input terminal with the voltage on the voltage line when the fourth switch is turned ON, and each of the even-numbered bit lines is supplied with the voltage on the voltage line when the fourth switch and an associated one of the second switches are turned ON.

4. The device as claimed in claim 3, further comprising:
a fifth switch coupled between the second input terminal of the first sense amplifier and the voltage line; and
a sixth switch coupled between the fourth input terminal of the second sense amplifier and the voltage line.

5. The device as claimed in claim 1, wherein the first and second switches are controlled such that in response to one of the odd-numbered bit lines being designated as a selected odd-numbered bit line, one of the first switches, that is connected to the selected odd-numbered bit line, and two of the second switches, that are connected to two consecutive even-numbered bit lines sandwiching the selected odd-numbered bit line therebetween, are turned ON while turning OFF each of the remaining first and second switches, and that in response to one of the even-numbered bit lines being designated as a selected even-numbered bit line, one of the second switches, that is connected to the selected even-numbered bit line, and two of the first switches, that are connected to two consecutive odd-numbered bit lines sandwiching the selected even-numbered bit line therebetween, are turned ON while turning OFF each of the remaining first and second switches.

6. The device as claimed in claim 5, wherein the third and fourth switches are controlled such that in response to one of the odd-numbered bit lines being designated as a selected odd-numbered bit line, the fourth switch is turned ON to electrically connect the voltage line to the two consecutive even-numbered bit lines sandwiching the selected odd-numbered bit line therebetween, and that in response to one of the even-numbered bit lines being designated as a selected even-numbered bit line, the third switch is turned ON to electrically connect the voltage line to the two consecutive odd-numbered bit lines sandwiching the selected even-numbered bit line therebetween.

7. The device as claimed in claim 6, wherein the third and fourth switches are further controlled such that in response to one of the odd-numbered bit lines being designated as the selected odd-numbered bit line, the third switch is turned ON with the fourth switch being tuned ON and is then tuned OFF while the fourth switch is still turned ON, and that in response to one of the even-numbered bit lines being designated as the selected even-numbered bit line, the fourth switch is turned ON with the third switch being tuned ON and is then tuned OFF while the third switch is still turned ON.

8. The device as claimed in claim 7, wherein each of the memory elements is of a nonvolatile type.

9. The device as claimed in claim 8, wherein each of the memory elements represents a first resistance value when storing a first data and a second resistance value when storing a second data, the first resistance value being different from the second resistance value.

10. The device as claimed in claim 1, wherein:
the first sense amplifier is configured, when activated, to amplify a potential difference between the first and second input terminals;
the second sense amplifier is configured, when activated, to amplify a potential difference between the third and fourth input terminals; and
the reference line supplies a reference level to each of the second input terminal of the first sense amplifier and the fourth input terminal of the second sense amplifier when at least one of the first and second sense amplifiers is activated.

11. The device as claimed in claim 10, wherein the reference line is configured to be charged with a voltage on the voltage line and changed from the voltage on the voltage line to the reference level.

12. The device as claimed in claim 11, further comprising a reference circuit that comprises;
an output terminal connected to the reference line;
a capacitance coupled between the output terminal and a ground line; and
a constant current source coupled between the output terminal and the ground line.

13. The device as claimed in claim 11, further comprising:
a fifth switch coupled between the second input terminal of the first sense amplifier and the voltage line; and
a sixth switch coupled between the fourth input terminal of the second sense amplifier and the voltage line,
each of the fifth and sixth switches being turned ON to charge the reference line to the voltage on the voltage line and OFF to change the reference line to the reference level.

14. The device as claimed in claim 13, wherein the first and second switches are controlled such that in response to one of the odd-numbered bit lines being designated as a selected odd-numbered bit line, one of the first switches, that is connected to the selected odd-numbered bit line, and two of the second switches, that are connected to two consecutive even-numbered bit lines sandwiching the selected odd-numbered bit line therebetween, are turned ON while turning OFF each of the remaining first and second switches, and that in response to one of the even-numbered bit lines being designated as a selected even-numbered bit line, one of the second switches, that is connected to the selected even-numbered bit line, and two of the first switches, that are connected to two consecutive odd-numbered bit lines sandwiching the selected even-numbered bit line therebetween, are turned ON while turning OFF each of the remaining first and second switches.

15. The device as claimed in claim 14, wherein the third and fourth switches are controlled such that in response to one of the odd-numbered bit lines being designated as the selected odd-numbered bit line, the fourth switch is turned ON to electrically connect the voltage line to the two consecutive even-numbered bit lines sandwiching the selected odd-numbered bit line therebetween, and that in response to one of the even-numbered bit lines being designated as the selected even-numbered bit line, the third switch is turned ON to electrically connect the voltage line to the two consecutive odd-numbered bit lines sandwiching the selected even-numbered bit line therebetween.

16. The device as claimed in claim 15, further comprising a plurality of seventh switches each coupled between an additional voltage line and an associated one of the odd-numbered and even-numbered bit lines.

17. The device as claimed in claim 16, wherein the seventh switches are controlled such that in response to one of the odd-numbered bit lines being designated as the selected odd-numbered bit line, three of the seventh switches, that are connected to the selected odd-numbered bit line and the two consecutive even-numbered bit lines sandwiching the selected odd-numbered bit line therebetween, are turned OFF while turning ON each of the remaining seventh switches, and that in response to one of the even-numbered bit lines being designated as the selected even-numbered bit line, three of the seventh switches, that are connected to the selected even-numbered bit line and the two consecutive odd-numbered bit lines sandwiching the selected even-numbered bit line therebetween, are turned OFF while turning ON each of the remaining the seventh switches.

18. The device as claimed in claim 17, wherein each of the memory elements is of a nonvolatile type.

19. The device as claimed in claim 18, wherein each of the memory elements represents a first resistance value when storing a first data and a second resistance value when storing a second data, the first resistance value being different from the second resistance value.

20. The device as claimed in claim 1, wherein the third switch is coupled between the voltage line and the first input terminal of the first sense amplifier without an intervention of any one of the first switches, the fourth switch is coupled between the voltage line and the third input terminal of the second sense amplifier without an intervention of any one of the second switches, and the reference line supplies a reference level to each of the second input terminal of the first sense amplifier and the fourth input terminal of the second sense amplifier when at least one of the first and second sense amplifiers is activated.

21. The device as claimed in claim 20, wherein the reference line is configured to be charged with a voltage on the voltage line during an initial setting operation of an access period, the first and second switches are controlled such that in response to one of the odd-numbered bit lines being designated as a selected odd-numbered bit line, the selected odd-numbered bit line and two consecutive even-numbered bit lines sandwiching the selected odd-numbered bit line are supplied with the voltage on the voltage line during the initial setting operation of the access period, and that in response to one of the even-numbered bit lines being designated as a selected even-numbered bit line, the selected even-numbered bit line and two consecutive odd-numbered bit lines sandwiching the selected even-numbered bit line are supplied with the voltage on the voltage line during the initial setting operation of the access period.

22. The device as claimed in claim 21, wherein the reference line is further configured to be changed from the voltage on the voltage line to the reference level during a sensing of the access period, the first and second switches are further controlled such that in response to one of the odd-numbered bit lines being designated as the selected odd-numbered bit line, the selected odd-numbered bit line stops being supplied with the voltage on the voltage line, the two consecutive even-numbered bit lines sandwiching the selected odd-numbered bit line keep being supplied with the voltage on the voltage line during the sensing of the access period, and that in response to one of the even-numbered bit lines being designated as the selected even-numbered bit line, the selected even-numbered bit line stops being supplied with the voltage on the voltage line, the two consecutive odd-numbered bit lines sandwiching the selected even-numbered bit line keep being supplied with the voltage on the voltage line during the sensing of the access period.

* * * * *